(12) United States Patent
Huang et al.

(10) Patent No.: US 11,842,933 B2
(45) Date of Patent: Dec. 12, 2023

(54) SEMICONDUCTOR DEVICE AND METHOD

(71) Applicant: Taiwan Semiconductor Manufacturing Co., Ltd., Hsinchu (TW)

(72) Inventors: Tsai-Yu Huang, Taoyuan (TW); Han-De Chen, Hsinchu (TW); Huicheng Chang, Tainan (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 101 days.

(21) Appl. No.: 17/150,018

(22) Filed: Jan. 15, 2021

(65) Prior Publication Data

US 2022/0230926 A1 Jul. 21, 2022

(51) Int. Cl.
*H01L 21/8238* (2006.01)
*H01L 27/092* (2006.01)
*H01L 29/06* (2006.01)
*H01L 29/423* (2006.01)
*H01L 29/786* (2006.01)
*H01L 21/764* (2006.01)

(52) U.S. Cl.
CPC .... *H01L 21/823878* (2013.01); *H01L 21/764* (2013.01); *H01L 21/823821* (2013.01); *H01L 27/0924* (2013.01); *H01L 29/0649* (2013.01); *H01L 29/0673* (2013.01); *H01L 29/42392* (2013.01); *H01L 29/78696* (2013.01)

(58) Field of Classification Search
CPC .......... H01L 29/785; H01L 21/823481; H01L 29/6681; H01L 27/0886; H01L 21/823475
See application file for complete search history.

(56) References Cited

U.S. PATENT DOCUMENTS

| | | | |
|---|---|---|---|
| 10,026,737 B1 | 7/2018 | Ching et al. | |
| 2009/0098706 A1* | 4/2009 | Kim | H01L 21/76232 257/E21.546 |
| 2013/0113026 A1* | 5/2013 | Huang | H01L 29/785 438/585 |
| 2014/0145247 A1* | 5/2014 | Cheng | H01L 27/0886 438/424 |
| 2017/0053825 A1* | 2/2017 | Seo | H01L 21/76224 |
| 2017/0092718 A1* | 3/2017 | Murata | H01L 21/02271 |
| 2019/0067079 A1* | 2/2019 | Belyansky | H01L 29/66818 |
| 2019/0067111 A1 | 2/2019 | Tsai et al. | |

(Continued)

FOREIGN PATENT DOCUMENTS

KR 20200113180 A 10/2020
TW 201837995 A 10/2018

*Primary Examiner* — Brian Turner
(74) *Attorney, Agent, or Firm* — Slater Matsil, LLP

(57) ABSTRACT

In an embodiment, a device includes: a first semiconductor strip over a substrate, the first semiconductor strip including a first channel region; a second semiconductor strip over the substrate, the second semiconductor strip including a second channel region; a dielectric strip disposed between the first semiconductor strip and the second semiconductor strip, a width of the dielectric strip decreasing along a first direction extending away from the substrate, the dielectric strip including a void; and a gate structure extending along the first channel region, along the second channel region, and along a top surface and sidewalls of the dielectric strip.

20 Claims, 37 Drawing Sheets

(56) References Cited

U.S. PATENT DOCUMENTS

| | | | |
|---|---|---|---|
| 2019/0067120 A1* | 2/2019 | Ching | H01L 27/0924 |
| 2019/0157407 A1* | 5/2019 | Singh | H01L 27/1203 |
| 2019/0252268 A1* | 8/2019 | Xie | H01L 29/4966 |
| 2019/0305082 A1 | 10/2019 | Ching et al. | |
| 2019/0326287 A1* | 10/2019 | Liaw | H01L 29/0653 |
| 2019/0378903 A1* | 12/2019 | Jeon | H01L 21/823431 |
| 2019/0385898 A1* | 12/2019 | Peng | H01L 21/76224 |
| 2020/0006077 A1* | 1/2020 | Wang | H01L 21/02247 |
| 2020/0006084 A1* | 1/2020 | Tsai | H01L 29/66545 |
| 2020/0075342 A1 | 3/2020 | Chen et al. | |
| 2020/0403084 A1 | 12/2020 | HIsu et al. | |
| 2021/0013105 A1 | 1/2021 | Zhu | |

* cited by examiner

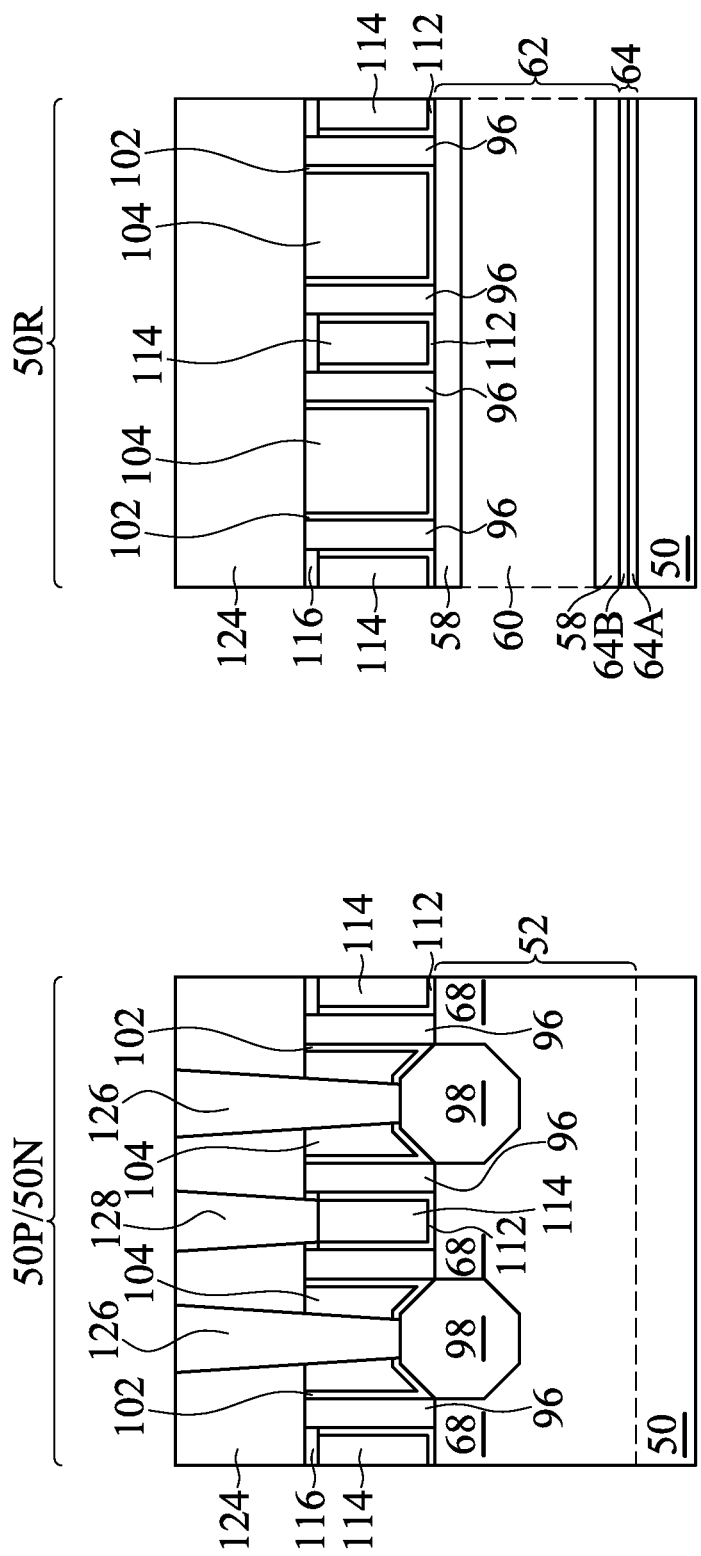

SEMICONDUCTOR DEVICE AND METHOD

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8, 9A, 9B, 9C, 9D, 10A, 10B, 10C, 11A, 11B, 11C, 12A, 12B, 12C, 13A, 13B, 13C, 14A, 14B, 14C, 15A, 15B, and 15C are cross-sectional views of intermediate stages in the manufacturing of FinFETs, in accordance with some embodiments.

DETAILED DESCRIPTION

Figure 1:
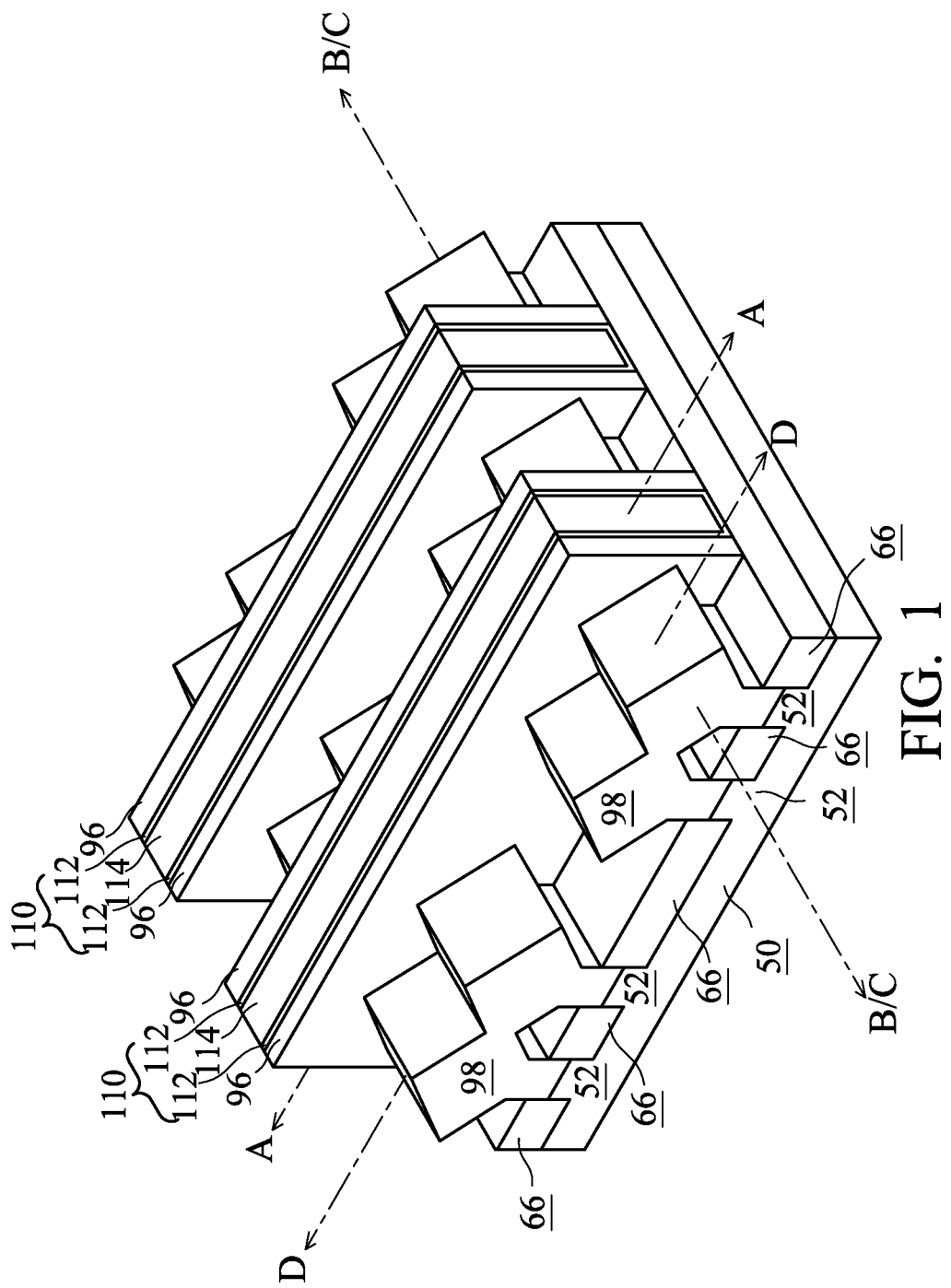
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a dummy fin is formed between active fins of FinFETs. The dummy fin has a similar height as the active fins, and can help reduce pattern loading effects during formation of the FinFETs. Further, the dummy fin is formed to include a void, which can help increase the electrical isolation between adjacent FinFETs.

FIG. 1 illustrates an example of simplified Fin Field-Effect Transistors (FinFETs) in a three-dimensional view, in accordance with some embodiments. Some other features of the FinFETs (discussed below) are omitted for illustration clarity. The illustrated FinFETs may be electrically coupled in a manner to operate as, for example, one transistor or multiple transistors, such as four transistors.

The FinFETs include fins 52 extending from a substrate 50. Shallow trench isolation (STI) regions 66 are disposed over the substrate 50, and the fins 52 protrude above and from between neighboring STI regions 66. Although the STI regions 66 are described/illustrated as being separate from the substrate 50, as used herein the term "substrate" may be used to refer to just the semiconductor substrate or a semiconductor substrate inclusive of isolation regions. Additionally, although the fins 52 are illustrated as being a single, continuous material of the substrate 50, the fins 52 and/or the substrate 50 may include a single material or a plurality of materials. In this context, the fins 52 refers to the portions extending between the neighboring STI regions 66.

Gate structures 110 are over channel regions of the fins 52. The gate structures 110 include gate dielectrics 112 and gate electrodes 114. The gate dielectrics 112 are along sidewalls and over top surfaces of the fins 52, and the gate electrodes 114 are over the gate dielectrics 112. Source/drain regions 98 are disposed in opposite sides of the fins 52 with respect to the gate dielectrics 112 and gate electrodes 114. Gate spacers 96 separate the source/drain regions 98 from the gate structures 110. In embodiments where multiple transistors are formed, the source/drain regions 98 may be shared between various transistors. In embodiments where one transistor is formed from multiple fins 52, neighboring source/drain regions 98 may be electrically coupled, such as through coalescing the source/drain regions 98 by epitaxial growth, or through coupling the source/drain regions 98 with a same source/drain contact. One or more inter-layer dielectric (ILD) layer(s) (discussed further below) are over the source/drain regions 98 and/or gate electrodes 114, through which contacts (discussed further below) to the source/drain regions 98 and the gate electrodes 114 are formed.

FIG. 1 further illustrates several reference cross-sections. Cross-section A-A is along a longitudinal axis of a gate electrode 114. Cross-section B/C-B/C is perpendicular to cross-section A-A and is along a longitudinal axis of a fin 52. Cross-section D-D is parallel to cross-section A-A and extends through source/drain regions 98 of the FinFETs. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 15C are cross-sectional views of intermediate stages in the manufacturing of FinFETs, in accordance with some embodiments. FIGS. 2, 3, 4, 6, 7, 8, 9A, 10A, 11A, 12A, 13A, 14A, and 15A illustrate reference cross-section A-A illustrated in FIG. 1, except for multiple fins/FinFETs. FIGS. 9B, 10B, 11B, 12B, 13B, 14B, and 15B illustrate reference cross-section B/C-B/C illustrated in FIG. 1, except for multiple fins/FinFETs. FIGS. 9C, 10C, 11C, 12C, 13C, 14C, and 15C illustrate reference cross-section C-C illustrated in FIG. 8, except for multiple fins/FinFETs. FIG. 9D illustrates reference cross-section D-D illustrated in FIG. 1, except for multiple fins/FinFETs.

Figure 2:
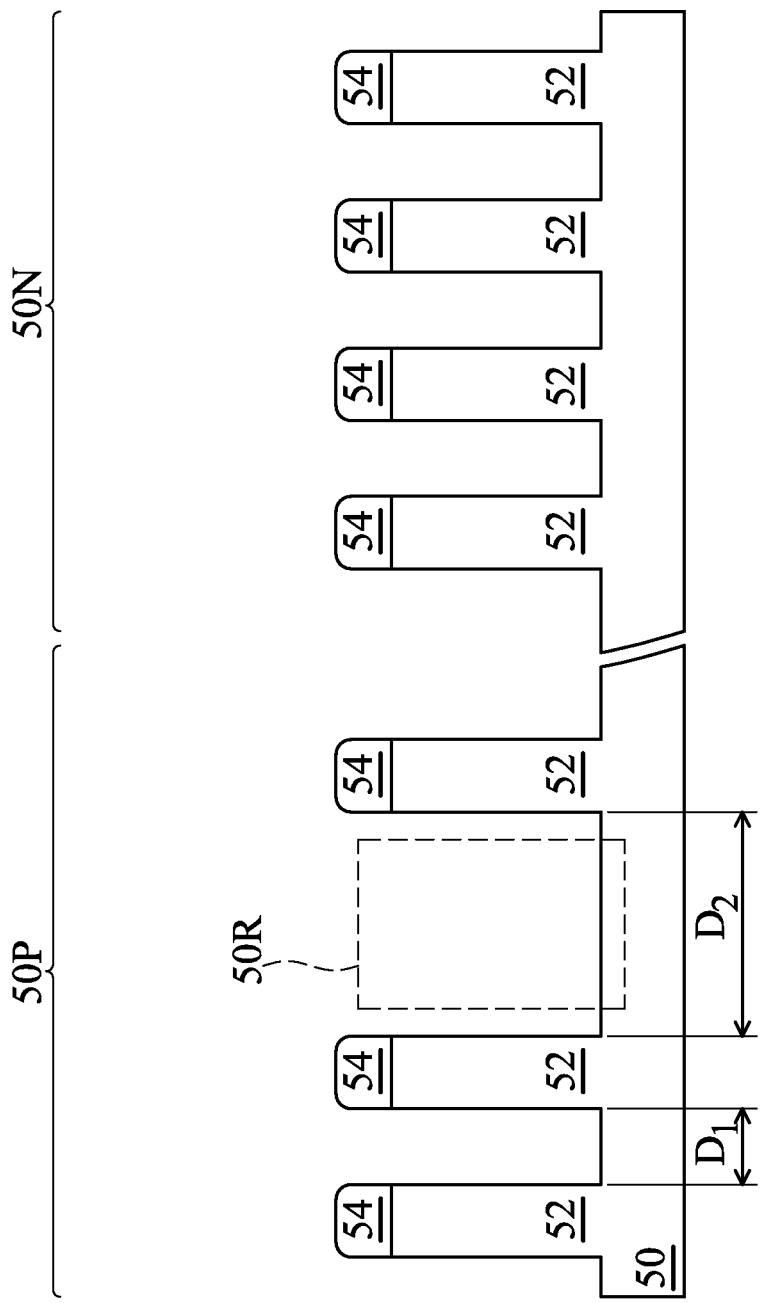

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P, and any number of device features (e.g., other active devices, doped regions, isolation structures, etc.) may be disposed between the n-type region 50N and the p-type region 50P.

Fins 52 are then formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof, and may be performed with masks 54 having a pattern of the fins 52. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the masks 54 (or other layer) may remain on the fins 52.

According to some embodiments, some regions of the substrate 50 are not patterned with fins 52. For example, an inactive region 50R of the substrate 50 is not covered by the masks 54, and does not include fins. The inactive region 50R may be any region of the substrate 50 where no devices, e.g., no FinFETs, are desired or formed. In the illustrated embodiment, the inactive region 50R is part of the p-type region 50P, and is disposed between adjacent p-type FinFETs in the p-type region 50P. In another embodiment (discussed further below), the inactive region 50R is part of the n-type region 50N, and is disposed between adjacent n-type FinFETs in the n-type region 50N. In yet another embodiment (discussed further below), the n-type region 50N and the p-type region 50P both include inactive regions 50R. The width of the inactive region 50R can be larger than the spacing between fins 52 outside of the inactive region 50R. For example, the fins 52 outside of the inactive region 50R can be spaced apart by a distance $D_1$, which can be in the range of about 10 nm to about 50 nm, while the fins 52 that border the inactive region 50R can be spaced apart by a distance $D_2$, which can be from about 2 to about 3 times larger than the distance $D_1$.

As discussed further below, dummy fins will be formed in the inactive region 50R to help reduce pattern loading effects in subsequent processing. The dummy fins are not used to form FinFETs and are also referred to as inactive fins or dielectric fins, in contrast to the fins 52, which are used to form FinFETs and are also referred to as active fins or semiconductor fins. In addition to helping reduce pattern loading effects in subsequent processing, the dummy fins are also formed to have a high relative permittivity, and thus also help electrically isolate adjacent devices, e.g., adjacent FinFETs, from one another. The formation of a single dummy fin in a single inactive region 50R is illustrated, but it should be appreciated that multiple dummy fins may be formed in a same inactive region 50R, and it should also be appreciated that multiple inactive regions 50R may be formed.

Figure 3:
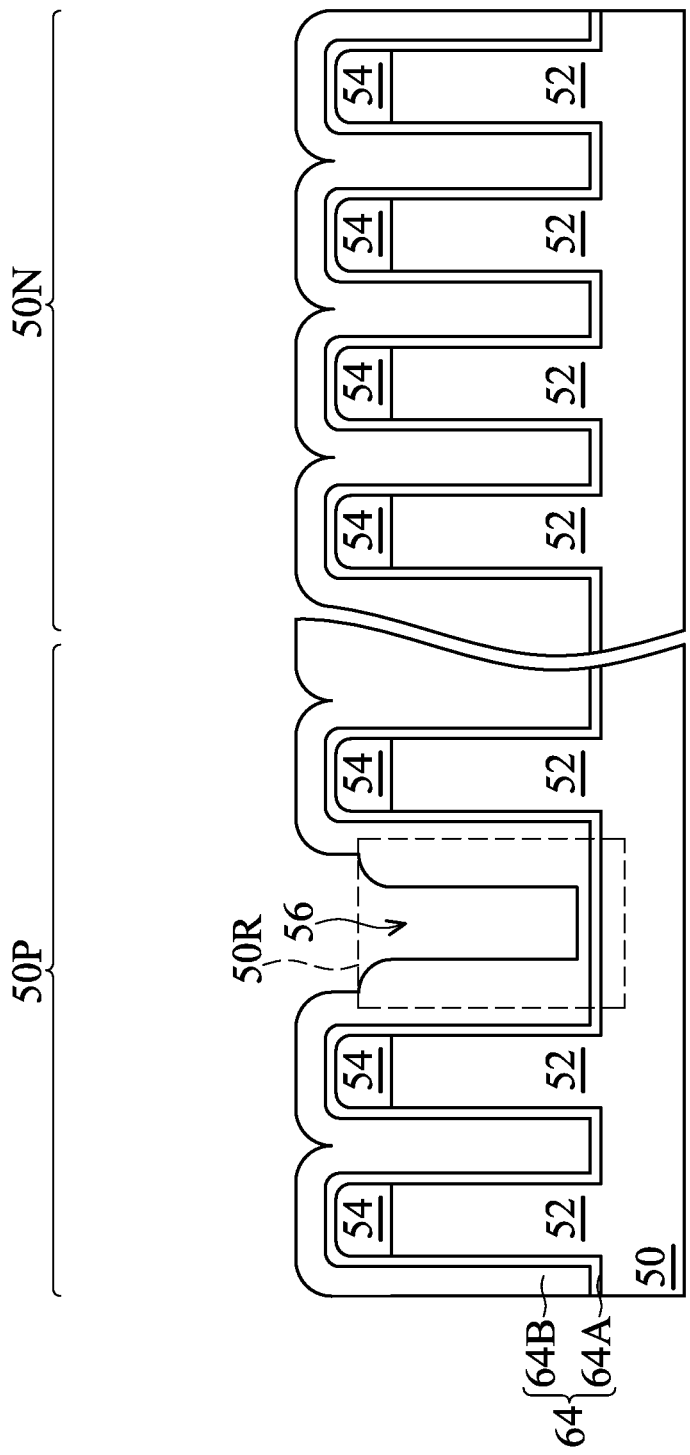

In FIG. 3, one or more layer(s) of insulation material 64 are formed over the substrate 50 and between neighboring active fins 52. The insulation material 64 includes an oxide, such as silicon oxide, a nitride, such as silicon nitride, the like, or a combination thereof, and may be formed by chemical vapor deposition (CVD), a high density plasma chemical vapor deposition (HDP-CVD), a flowable CVD (FCVD) (e.g., a CVD-based material deposition in a remote plasma system and post curing to make it convert to another material, such as an oxide), atomic layer deposition (ALD), the like, or a combination thereof. Other insulation materials formed by any acceptable process may be used. In the illustrated embodiment, the insulation material 64 includes a liner 64A on surfaces of the substrate 50 and the active fins 52, and a fill material 64B on the liner 64A. The liner 64A may be amorphous silicon, silicon oxide, silicon nitride, or the like formed by an ALD process, and the fill material 64B may be silicon oxide formed by a FCVD process. In another embodiment, a single layer of insulation material 64 is formed. An anneal process may be performed once the insulation material is formed. The anneal process may be performed in an environment containing $H_2$ or $O_2$. The liner 64A can be oxidized by the anneal process so that after annealing, the liner 64A is a similar material as the fill material 64B. In an embodiment, the insulation material 64 is formed such that excess insulation material 64 covers the active fins 52 or the masks 54 (if present).

The insulation material 64 has different thicknesses across the substrate 50, and may not fill the gaps between all of the active fins 52. Specifically, because the spacing distance $D_2$ is larger than the spacing distance $D_1$ (see FIG. 2), the insulation material 64 may not completely fill the inactive region 50R. For example, the dispensed volume of the insulation material 64 may be insufficient to completely fill the inactive region 50R. The insulation material 64 in the inactive region 50R may instead conformally line the substrate 50 and the sidewalls of the active fins 52 that border the inactive region 50R. Portions of the insulation material 64 in the inactive region 50R thus include a recess 56 between the active fins 52 that border the inactive region 50R. The shape and dimensions of the recess 56 will be discussed further below with respect to FIG. 5.

Figure 4:
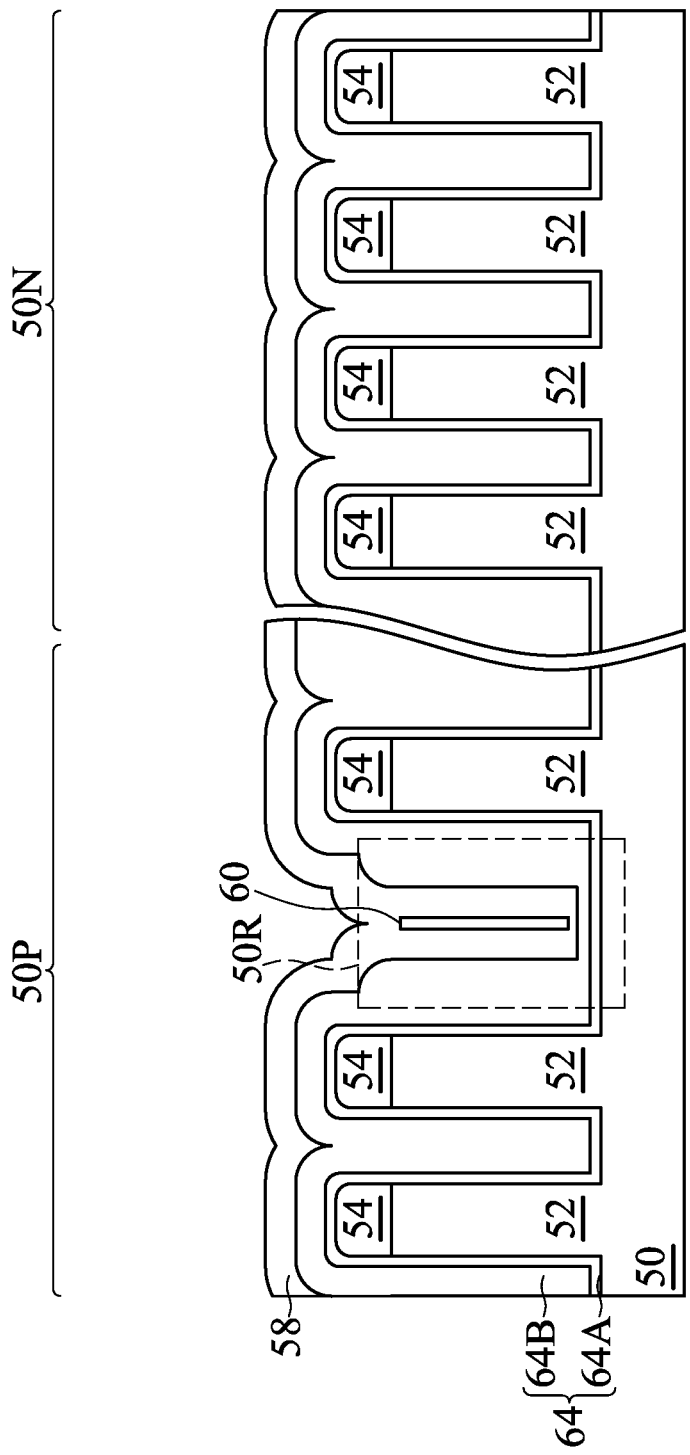

In FIG. 4, a dielectric layer 58 is formed on the insulation material 64. The dielectric layer 58 lines the recess 56. The dielectric layer 58 may be formed of silicon oxynitride, silicon oxycarbonitride, silicon nitride, or the like, and may be formed by ALD, CVD, or the like. The dielectric layer 58 is formed of a material that has a high etching selectivity from the etching of the insulation material 64. Further, the material of the dielectric layer 58 has a greater relative permittivity than the material(s) of the insulation material 64. For example, the insulation material 64 can be formed of a material that has a relative permittivity in the range of about 10 to about 12 and the dielectric layer 58 can be formed of a material that has a relative permittivity in the range of about 4 to about 7. In some embodiments, the dielectric layer 58 is silicon oxynitride formed by ALD. In another embodiment, the material of the dielectric layer 58 has a lesser relative permittivity than the material(s) of the insulation material 64.

Figure 5:
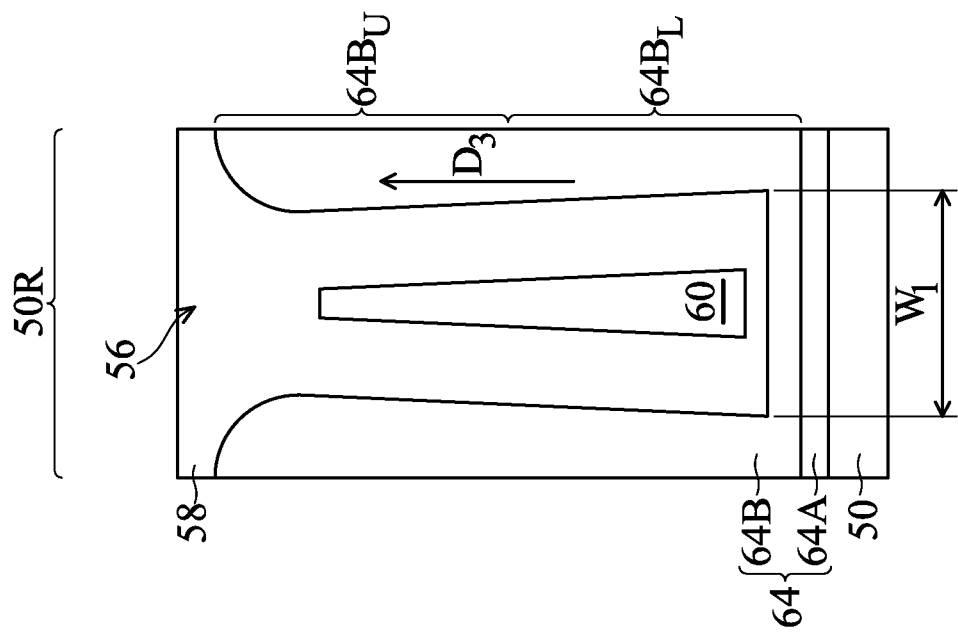

FIG. 5 is a detailed view of the inactive region 50R from FIG. 4. The shape and dimensions of the recess 56 are more clearly illustrated. Due to the method by which the insulation material 64 is formed, the recess 56 has a reentrant profile shape, where the width $W_1$ of the recess 56 decreases along a direction $D_3$ extending from the bottom of the fill material 64B to the top of the fill material 64B. In other words, the width $W_1$ at the bottom of the recess 56 is greater than the width $W_1$ at the top of the recess 56. For example, the width $W_1$ can be in the range of about 10 nm to about 30 nm, and the width $W_1$ at the bottom of the recess 56 can be from about 0% to about 30% greater than the width $W_1$ at the top of the recess 56. The recess 56 can be formed with a reentrant profile shape when the fill material 64B is silicon oxide formed by a FCVD process.

In other embodiments, the fill material 64B is formed by depositing amorphous silicon with CVD, and then oxidizing the amorphous silicon to form silicon oxide. Oxidation can be by a plasma oxidation process, where oxidation occurs directionally. As such, the upper portion $64B_U$ of the fill material 64B is more oxidized than the lower portion $64B_L$ of the fill material 64B. In other words, when plasma oxidation is used, the oxygen concentration of the fill material 64B increases through the fill material 64B in a direction $D_3$ extending from the bottom of the fill material 64B to the top of the fill material 64B. The volume of silicon is increased when it is oxidized. Because the upper portion $64B_U$ of the fill material 64B is more oxidized than the lower portion $64B_L$ of the fill material 64B, the oxidation increases the volume of the upper portion $64B_U$ of the fill material 64B more than the volume of the lower portion $64B_L$ of the fill material 64B. The width $W_1$ at the bottom of the recess 56 is thus greater than the width $W_1$ at the top of the recess 56 after oxidation. In some embodiments, the width $W_1$ at the bottom of the recess 56 is less than or equal to the width $W_1$ at the top of the recess 56 before oxidation, and the width $W_1$ at the bottom of the recess 56 is greater than the width $W_1$ at the top of the recess 56 after oxidation.

Because the recess 56 has a reentrant profile shape, pinch-off occurs at the top of the recess 56 during deposition of the dielectric layer 58. In some embodiments, the dielectric layer 58 is deposited until a void 60 is formed. The void 60 includes portions of the recess 56 that are unfilled by the dielectric layer 58. The void 60 can be at a vacuum or filled with a gas (e.g., air) depending on the processing conditions during deposition of the dielectric layer 58. The void 60 has a similar profile shape as the recess 56, e.g., a reentrant profile shape. The shape and dimensions of the void 60 will be discussed further below with respect to FIG. 16.

Figure 6:
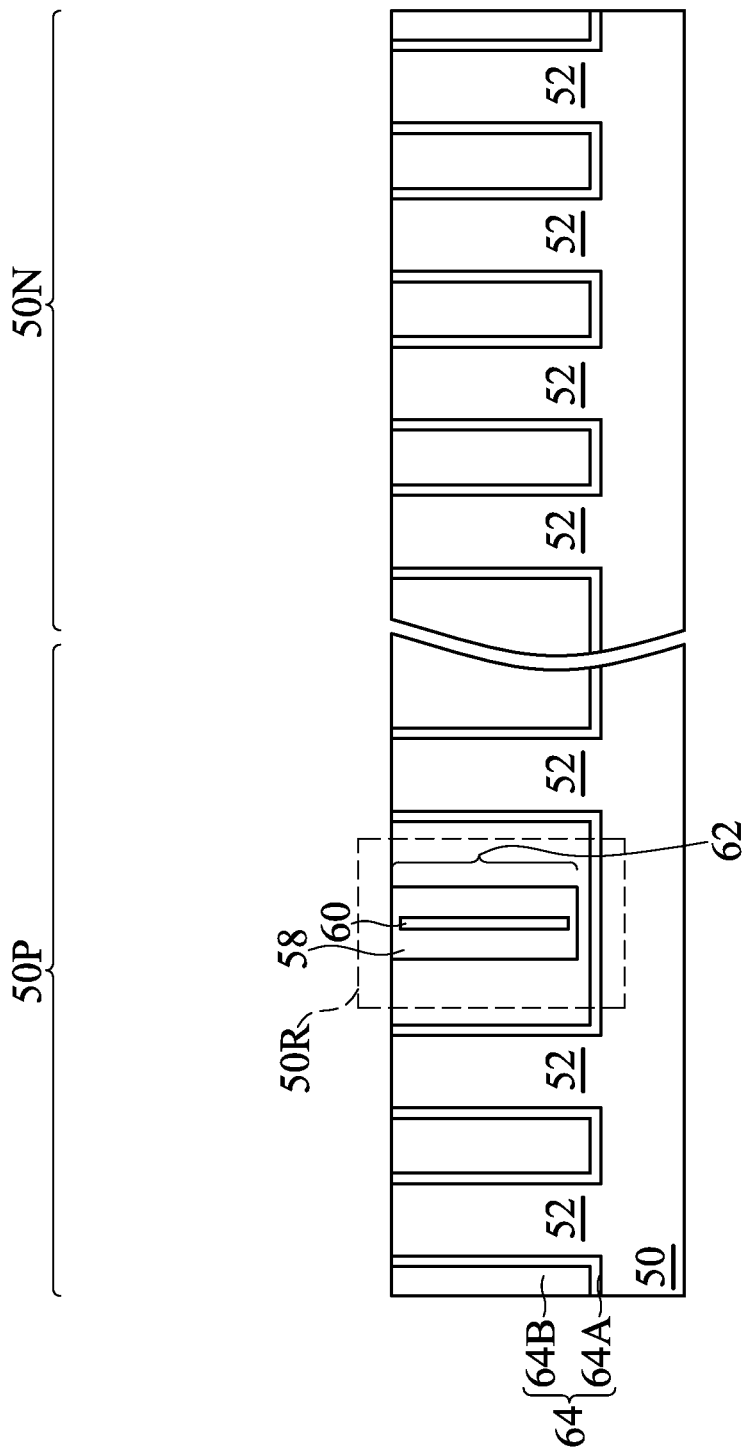

In FIG. 6, a removal process is applied to the dielectric layer 58 and the insulation material 64 to remove excess portions of the dielectric layer 58 and the insulation material 64 over the active fins 52. In some embodiments, a planarization process such as a chemical mechanical polish (CMP), an etch-back process, combinations thereof, or the like may be utilized. The removal process forms a dummy fin 62, which includes the remaining portions of the dielectric layer 58 in the recess 56 (see FIG. 5). The dummy fin 62 is a dielectric strip. After the removal process, some portions of the dielectric layer 58 remain over the void 60, so that the void 60 is not breached. The dummy fin 62 is disposed between the active fins 52 that border the inactive region 50R. In the illustrated embodiment, the dummy fin 62 is disposed between active fins 52 in the p-type region 50P. The planarization process exposes the active fins 52 and the dummy fin 62 such that top surfaces of the active fins 52, the dummy fin 62, and the insulation material 64 are coplanar after the planarization process is complete. In embodiments in which the masks 54 remain on the active fins 52, the planarization process may expose the masks 54 or remove the masks 54 such that top surfaces of the masks 54 or the active fins 52, respectively, the dummy fin 62, and the insulation material 64 are coplanar after the planarization process is complete.

The dummy fin 62 is equidistantly spaced from adjacent active fins 52, and the top surfaces of the dummy fin 62 and the active fins 52 are disposed a same distance from the substrate 50. As such, the dummy fin 62 helps reduce pattern loading effects in subsequent processing, such as in subsequent CMP or etching process(es). The shape and dimensions of the dummy fin 62 will be discussed further below with respect to FIG. 16. The dummy fin 62 include a dielectric layer 58 and a void 60, with the dielectric layer 58 surrounding the void 60. In this embodiment, the void 60 is continuously enclosed by the dielectric layer 58. The void 60 is filled with air or at a vacuum, and thus has a low relative permittivity, such as a relative permittivity of about 1. In some embodiments, the relative permittivity of the void 60 is less than the relative permittivity of the dielectric layer 58 and the relative permittivity of the STI regions 66. Forming the void 60 decreases the total effective conductance of the dummy fin 62. The dummy fin 62 thus provides a greater amount of electrical isolation than dummy fins formed of semiconductor materials or a single dielectric material. As such, in addition to helping reduce pattern loading effects in subsequent processing, the dummy fin 62 also helps electrically isolate adjacent active fins 52 (and their resulting FinFETs) from one another. Specifically, the dielectric layer 58 and the void 60 act as dielectric mediums for a network of parasitic capacitors disposed between the active fins 52 that border the inactive region 50R. Forming the void 60 can help decrease the effective capacitance of the capacitor network by from about 10% to about 14%. The parasitic capacitance of the resulting FinFETs may thus be reduced, thereby increasing the performance of the FinFETs.

Figure 7:
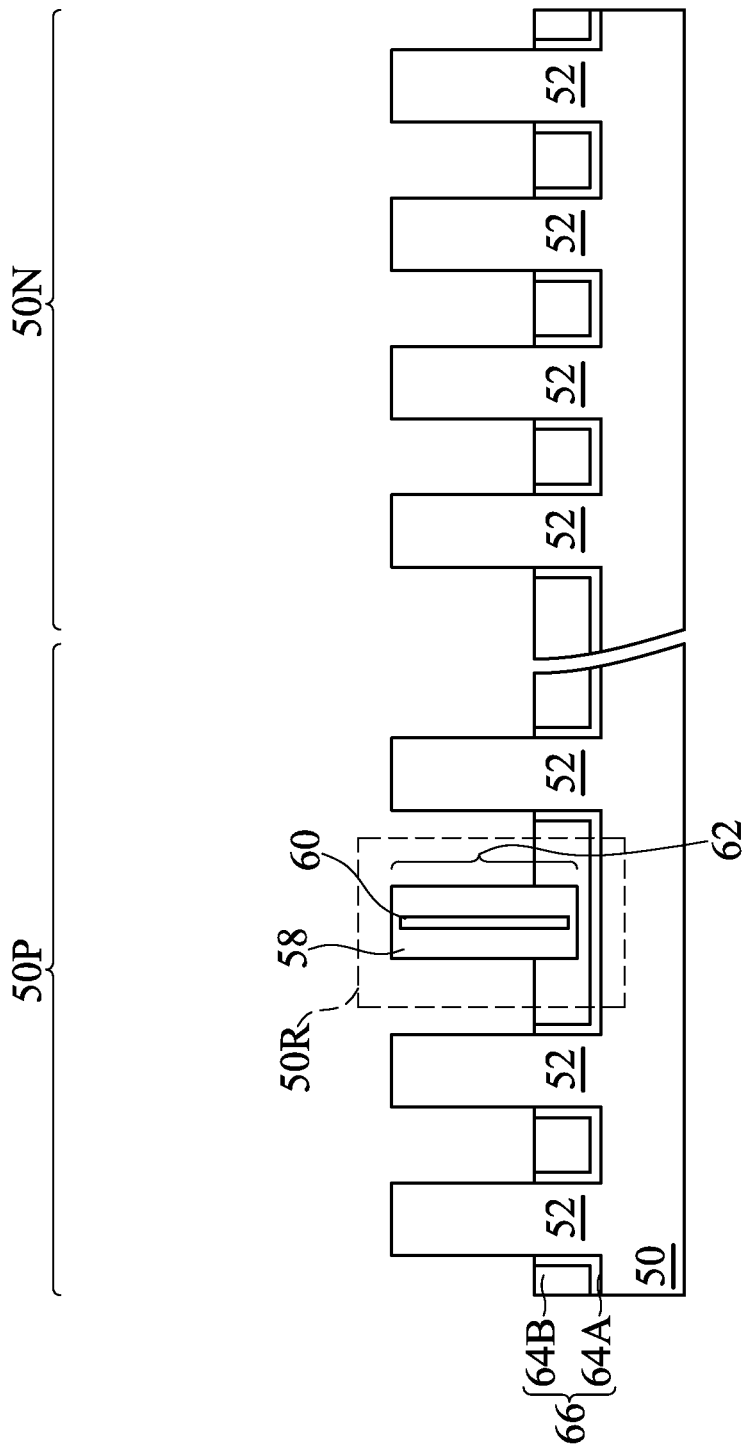

In FIG. 7, the insulation material 64 is recessed to form STI regions 66. The insulation material 64 is recessed such that upper portions of the active fins 52 and the dummy fin 62 protrude above and from between neighboring STI regions 66. Further, the top surfaces of the STI regions 66 may have a flat surface as illustrated, a convex surface, a concave surface (such as dishing), or a combination thereof. The top surfaces of the STI regions 66 may be formed flat, convex, and/or concave by an appropriate etch. The STI regions 66 may be recessed using an acceptable etching process, such as one that is selective to the material(s) of the insulation material 64. For example, an oxide removal using, for example, dilute hydrofluoric (dHF) acid may be used. The etching process selectively etches the material(s) of the insulation material 64 at a faster rate than the material(s) of the active fins 52 and the dummy fin 62. For example, the material of the dielectric layer 58 (e.g., silicon oxynitride) and the material(s) of the insulation material 64 (e.g., silicon and silicon oxide) can have an etch selectivity in the range of about 20:1 to about 1000:1, relative the etching process. The dielectric layer 58 may thus be protected from damage during formation of the dummy fin 62. The dummy fin 62 helps reduce pattern loading effects during the recessing, and as such, portions of the insulation material 64 around the dummy fin 62 are recessed by a same amount as portions of the insulation material 64 around the active fins 52.

The process described with respect to FIGS. 2 through 7 is just one example of how the active fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form the active fins 52. Additionally, in some embodiments, heteroepitaxial structures can be used for the active fins 52. For example, the active fins 52 in FIG. 7 can be recessed, and a material different from the active fins 52 may be epitaxially grown over the recessed active fins 52. In such embodiments, the active fins 52 include the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the active fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the active fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 7, appropriate wells (not shown) may be formed in the active fins 52 and/or the substrate 50. In some embodiments, a p-type well may be formed in the n-type region 50N, and a n-type well may be formed in the p-type region 50P. In some embodiments, a p-type well or an n-type well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the active fins 52 and the STI regions 66 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of up to about $10^{18}$ cm$^{-3}$, such as in the range of about $10^{16}$ cm$^{-3}$ to about $10^{18}$ cm$^{-3}$. After the implant, the photoresist is removed, such as by an acceptable ashing process.

Following the implanting of the p-type region 50P, a photoresist is formed over the active fins 52 and the STI regions 66 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of up to about $10^{18}$ cm$^{-3}$, such as in the range of about $10^{16}$ cm$^{-3}$ to about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

In some embodiments, the implants for forming the wells are performed before the dummy fin 62 is formed. Thus, the dummy fin 62 can be free from the implanted impurities at this step of processing. However, as discussed in greater detail below, the dummy fin 62 can be implanted with impurities at a later step of processing.

Figure 8:
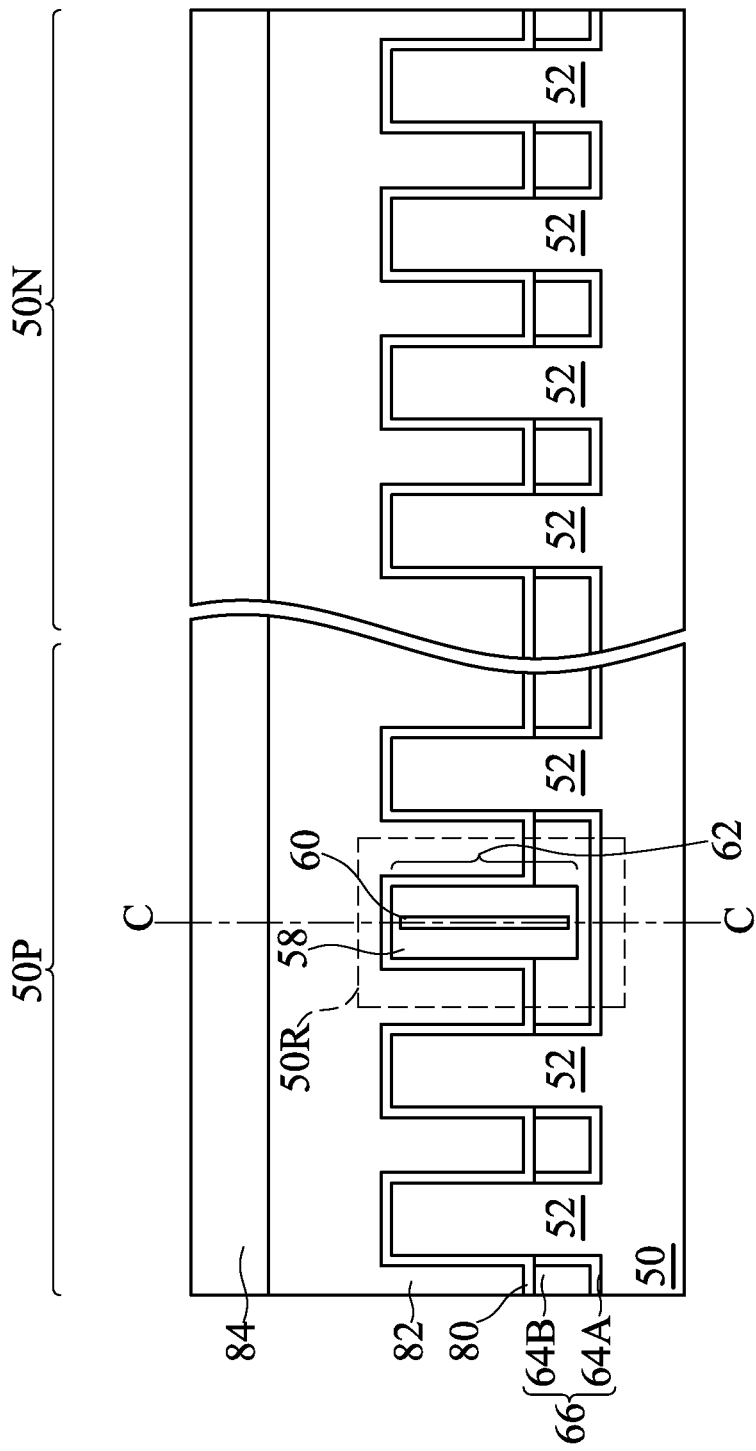

In FIG. 8, a dummy dielectric layer 80 is formed on the active fins 52 and the dummy fin 62. The dummy dielectric layer 80 may be, for example, silicon oxide, silicon nitride, a combination thereof, or the like, and may be deposited or thermally grown according to acceptable techniques. The dummy dielectric layer 80 is formed of a material that has a high etching selectivity from the etching of the dielectric layer 58. A dummy gate layer 82 is formed over the dummy dielectric layer 80, and a mask layer 84 is formed over the dummy gate layer 82. The dummy gate layer 82 may be deposited over the dummy dielectric layer 80 and then planarized, such as by a CMP. The dummy fin 62 helps reduce pattern loading effects during the planarization of the dummy gate layer 82. The mask layer 84 may be deposited over the dummy gate layer 82. The dummy gate layer 82 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 82 may be deposited by physical vapor deposition (PVD), CVD, sputter deposition, or other techniques for depositing the selected material. The dummy gate layer 82 may be made of other materials that have a high etching selectivity from the etching of isolation regions, e.g., the STI regions 66 and/or the dummy dielectric layer 80. The mask layer 84 may include one or more layers of, for example, silicon nitride, silicon oxynitride, or the like. In this example, a single dummy gate layer 82 and a single mask layer 84 are formed across the n-type region 50N and the p-type region 50P. In the illustrated embodiment, the dummy dielectric layer 80 is deposited such that the dummy dielectric layer 80 covers the active fins 52, the dummy fin 62, and the STI regions 66, extending over the STI regions 66 and between the dummy gate layer 82 and the STI regions 66. In another embodiment, such as when the dummy dielectric layer 80 is formed by thermal growth, the dummy dielectric layer 80 covers only the active fins 52 and does not cover the dummy fin 62.

FIGS. 9A through 15C illustrate further intermediate stages in the manufacturing of FinFETs. FIGS. 9B, 10B, 11B, 12B, 13B, 14B, and 15B illustrate features in either of the n-type region 50N and the p-type region 50P. For example, the structures illustrated in FIGS. 9B, 10B, 11B, 12B, 13B, 14B, and 15B may be applicable to both the n-type region 50N and the p-type region 50P. FIGS. 9C, 10C, 11C, 12C, 13C, 14C, and 15C illustrate features in the inactive region 50R. As noted above, the inactive region 50R can be part of the p-type region 50P or part of the n-type region 50N. Differences (if any) in the structures of the n-type region 50N and the p-type region 50P are described in the text accompanying each figure.

Figure 9A:
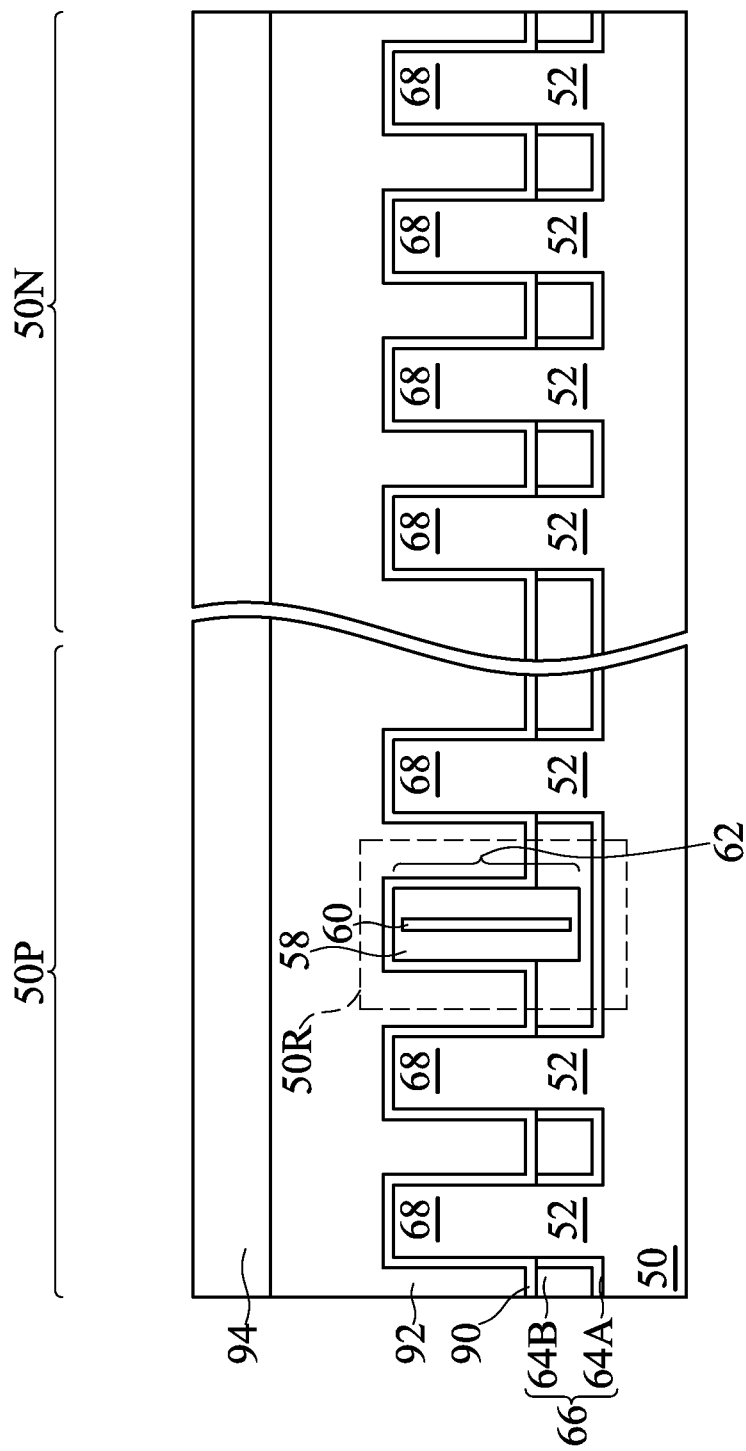
Figure 9C:
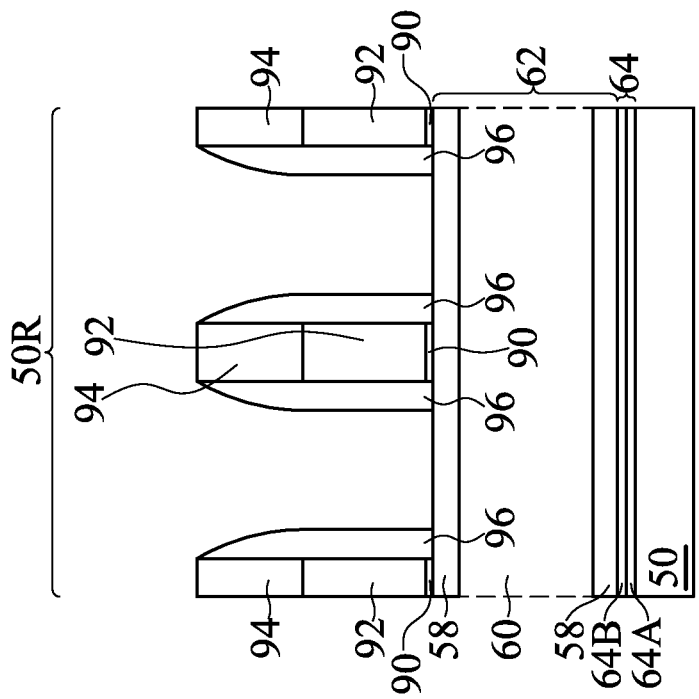
Figure 9B:
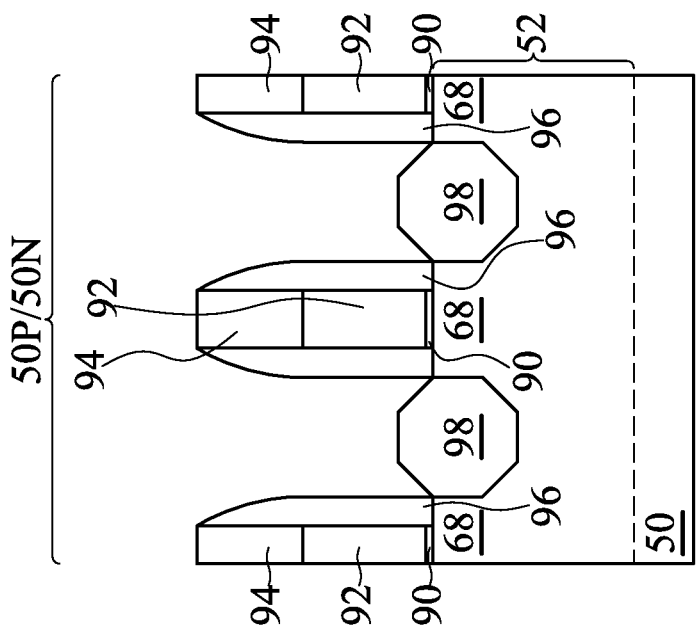
Figure 9D:
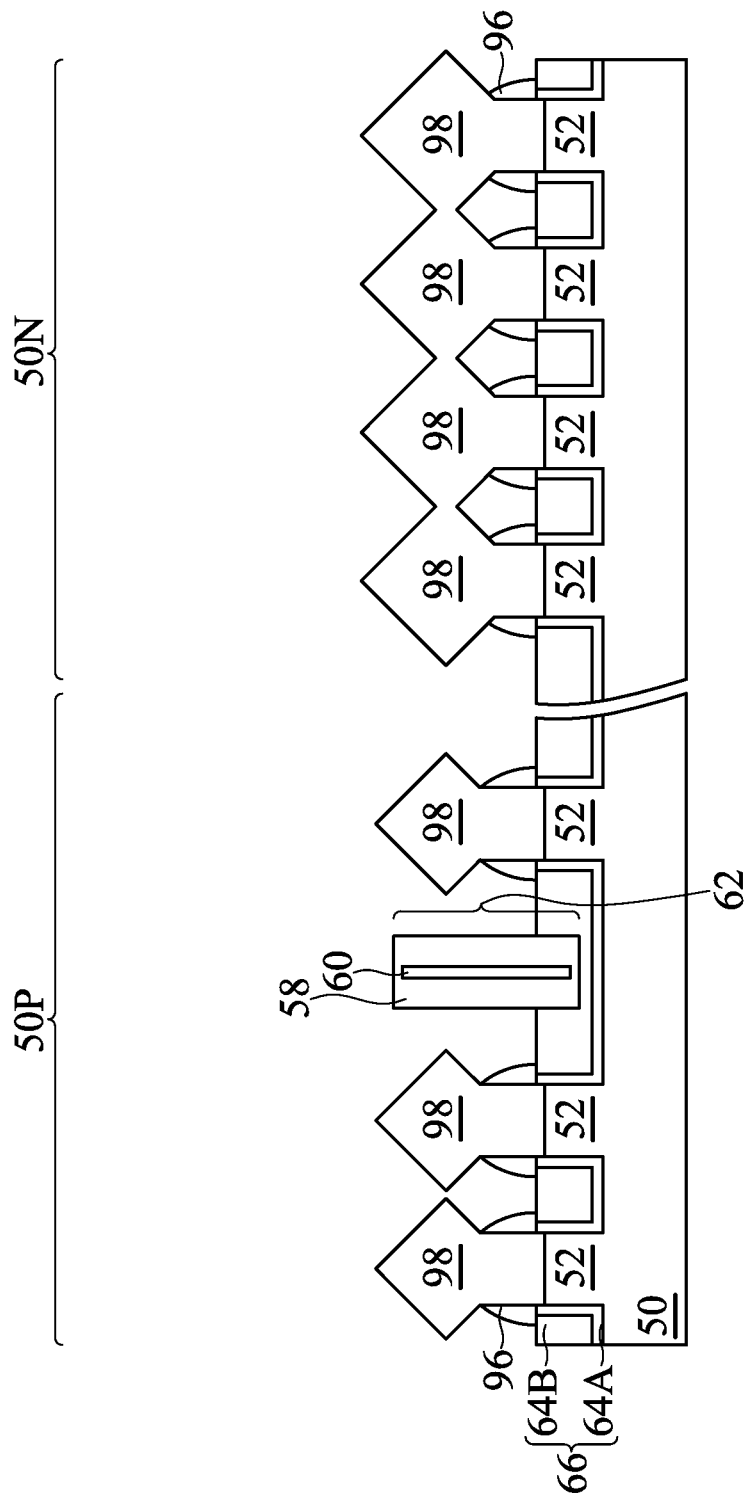

In FIGS. 9A through 9C, the mask layer 84 (see FIG. 8) may be patterned using acceptable photolithography and etching techniques to form masks 94. The pattern of the masks 94 may then be transferred to the dummy gate layer 82 by an acceptable etching technique to form dummy gates 92. In some embodiments, the pattern of the masks 94 may also be transferred to the dummy dielectric layer 80 by an acceptable etching technique to form dummy dielectrics 90. The dummy gates 92 cover the dummy fin 62 and respective channel regions 68 of the active fins 52. The pattern of the masks 94 may be used to physically separate each of the dummy gates 92 from adjacent dummy gates. The dummy gates 92 may also have a lengthwise direction substantially perpendicular to the lengthwise direction of respective active fins 52/dummy fin 62.

Gate spacers 96 are formed along sidewalls of the dummy gates 92 and the masks 94. The gate spacers 96 may be formed by conformally depositing an insulating material and subsequently anisotropically etching the insulating material. The insulating material of the gate spacers 96 may be silicon oxide, silicon nitride, silicon oxynitride, silicon carbonitride, silicon oxycarbonitride, a combination thereof, or the like. For example, the gate spacers 96 can include multiple layers of silicon oxycarbonitride, or can include a layer of silicon nitride between two layers of silicon oxide.

During or after the formation of the gate spacers 96, implants for lightly doped source/drain (LDD) regions may be performed. In the embodiments with different device types, similar to the implants discussed above in FIG. 7, a mask, such as a photoresist, may be formed over the n-type region 50N, while exposing the p-type region 50P, and appropriate type (e.g., p-type) impurities may be implanted into the exposed active fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed active fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

The implants for forming the LDD regions can also implant the dummy fin 62 with impurities. For example, when the dummy fin 62 is formed in the p-type region 50P, the upper portion of the dummy fin 62 (e.g., the portion of the dummy fin 62 above the surfaces of the STI regions 66) can be implanted with the p-type impurity implanted in the p-type region 50P. Likewise, when the dummy fin 62 is formed in the n-type region 50N, the upper portion of the dummy fin 62 (e.g., the portion of the dummy fin 62 above the surfaces of the STI regions 66) can be implanted with the n-type impurity implanted in the n-type region 50N.

Epitaxial source/drain regions 98 are then formed in the active fins 52. The epitaxial source/drain regions 98 are formed in the active fins 52 such that each dummy gate 92 is disposed between respective neighboring pairs of the epitaxial source/drain regions 98. In some embodiments the epitaxial source/drain regions 98 may extend into, and may also penetrate through, the active fins 52. In some embodiments, the gate spacers 96 are used to separate the epitaxial source/drain regions 98 from the dummy gates 92 by an appropriate lateral distance so that the epitaxial source/drain regions 98 do not short out subsequently formed gates of the resulting FinFETs. A material of the epitaxial source/drain regions 98 may be selected to exert stress in the respective channel regions 68, thereby improving performance.

The epitaxial source/drain regions 98 in the n-type region 50N may be formed by masking the p-type region 50P and etching source/drain regions of the active fins 52 in the n-type region 50N to form recesses in the active fins 52. The etching is selective to the active fins 52 such that recesses (and thus epitaxial source/drain regions) are not formed in the dummy fin 62. Then, the epitaxial source/drain regions 98 in the n-type region 50N are epitaxially grown in the recesses. The epitaxial source/drain regions 98 may include any acceptable material, such as appropriate for n-type FinFETs. For example, if the active fins 52 are silicon, the epitaxial source/drain regions 98 in the n-type region 50N may include materials exerting a tensile strain in the respective channel regions 68, such as silicon, silicon carbide, phosphorous doped silicon carbide, silicon phosphide, or the like. The epitaxial source/drain regions 98 in the n-type region 50N may have surfaces raised from respective surfaces of the active fins 52 and may have facets.

The epitaxial source/drain regions 98 in the p-type region 50P may be formed by masking the n-type region 50N and etching source/drain regions of the active fins 52 in the p-type region 50P to form recesses in the active fins 52. The etching is selective to the active fins 52 such that recesses (and thus epitaxial source/drain regions) are not formed in the dummy fin 62. Then, the epitaxial source/drain regions 98 in the p-type region 50P are epitaxially grown in the recesses. The epitaxial source/drain regions 98 may include any acceptable material, such as appropriate for p-type FinFETs. For example, if the active fins 52 are silicon, the epitaxial source/drain regions 98 in the p-type region 50P may include materials exerting a compressive strain in the respective channel regions 68, such as silicon-germanium, boron doped silicon-germanium, germanium, germanium tin, or the like. The epitaxial source/drain regions 98 in the p-type region 50P may have surfaces raised from respective surfaces of the active fins 52 and may have facets.

The epitaxial source/drain regions 98 and/or the active fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 98 may be in situ doped during growth.

As a result of the epitaxy processes used to form the epitaxial source/drain regions 98 in the n-type region 50N and the p-type region 50P, upper surfaces of the epitaxial source/drain regions have facets which expand laterally outward beyond sidewalls of the active fins 52. In some embodiments, these facets cause adjacent epitaxial source/drain regions 98 of a same FinFET to merge. In some embodiments, adjacent epitaxial source/drain regions 98 remain separated after the epitaxy process is completed. In some embodiments, adjacent epitaxial source/drain regions 98 of a same FinFET merge in a first region (e.g., the n-type region 50N), and adjacent epitaxial source/drain regions 98 remain separated in a second region (e.g., the p-type region 50P), as illustrated by FIG. 9D. In the embodiment illustrated in FIG. 9D, the gate spacers 96 are formed covering a portion of the sidewalls of the active fins 52 that extend above the STI regions 66 thereby blocking the epitaxial growth. In some other embodiments, the spacer etch used to form the gate spacers 96 may be adjusted to remove the spacer material to allow the epitaxially grown region to extend to the surface of the STI regions 66.

It is noted that the above disclosure generally describes a process of forming dummy gates, spacers, LDD regions, and source/drain regions. Other processes and sequences may be used. For example, fewer or additional spacers may be utilized, different sequence of steps may be utilized, spacers may be formed and removed, and/or the like. Furthermore, the n-type and p-type devices may be formed using a different structures and steps.

Figure 10A:
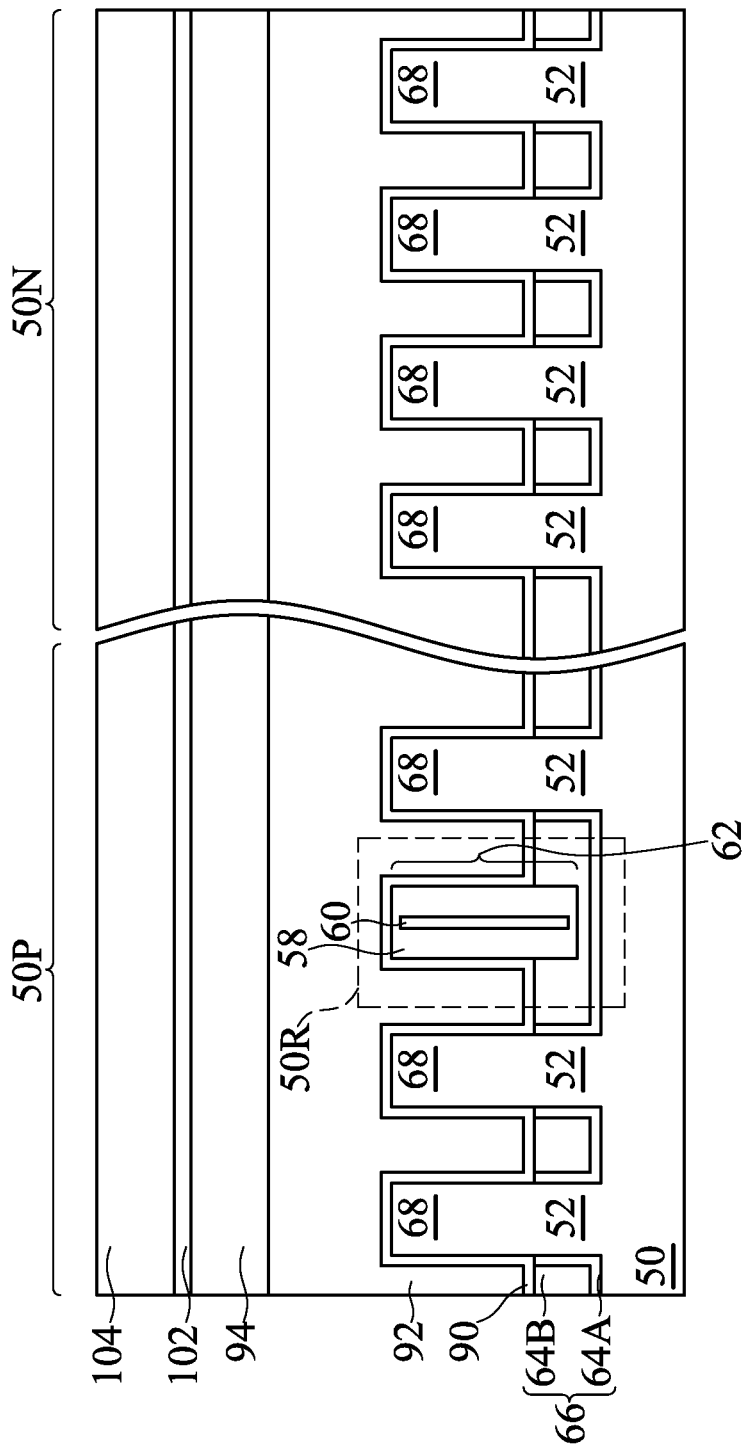
Figure 10C:
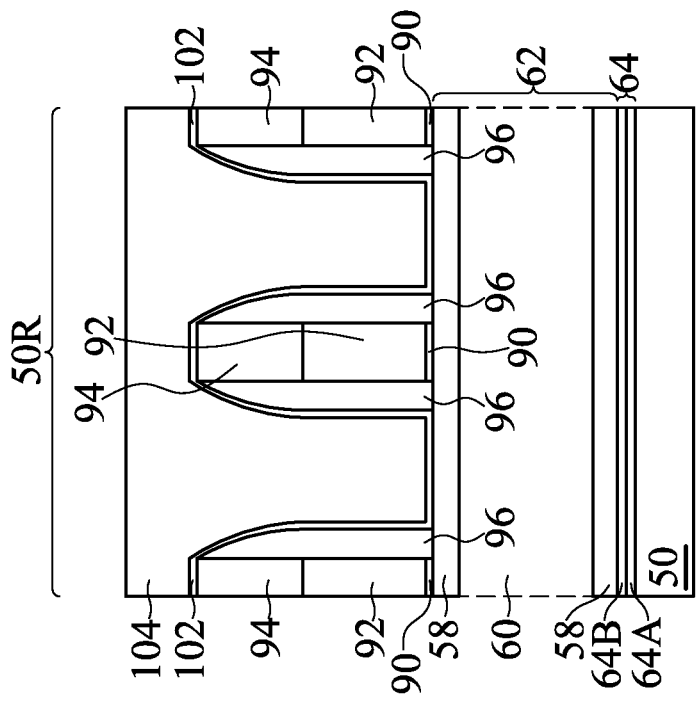
Figure 10B:
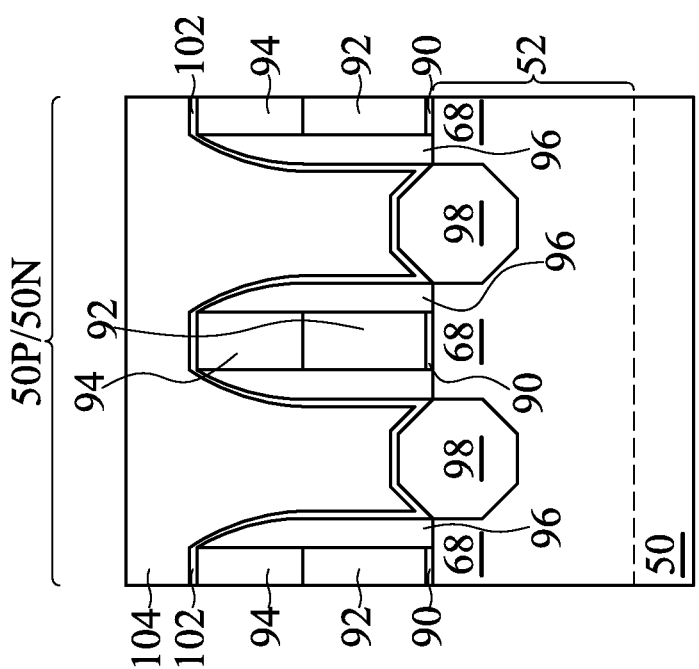

In FIGS. 10A through 10C, a first interlayer dielectric (ILD) layer 104 is deposited over the epitaxial source/drain regions 98, the gate spacers 96, the dummy gates 92 or the masks 94 (if present), and the dummy fin 62. The first ILD layer 104 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, the first ILD layer 104 is a flowable film formed by a flowable CVD method. In some embodiments, a contact etch stop layer (CESL) 102 is disposed between the first ILD layer 104 and the epitaxial source/drain regions 98, the gate spacers 96, the dummy gates 92 or the masks 94 (if present), and the dummy fin 62. The CESL 102 may include a dielectric material, such as, silicon nitride, silicon oxide, silicon oxynitride, or the like, having a lower etch rate than the material of the first ILD layer 104. Because no epitaxial source/drain regions are formed in the dummy fin 62, the CESL 102 may thus extend along a top surface of the dummy fin 62, between adjacent gate spacers 96.

Figure 11A:
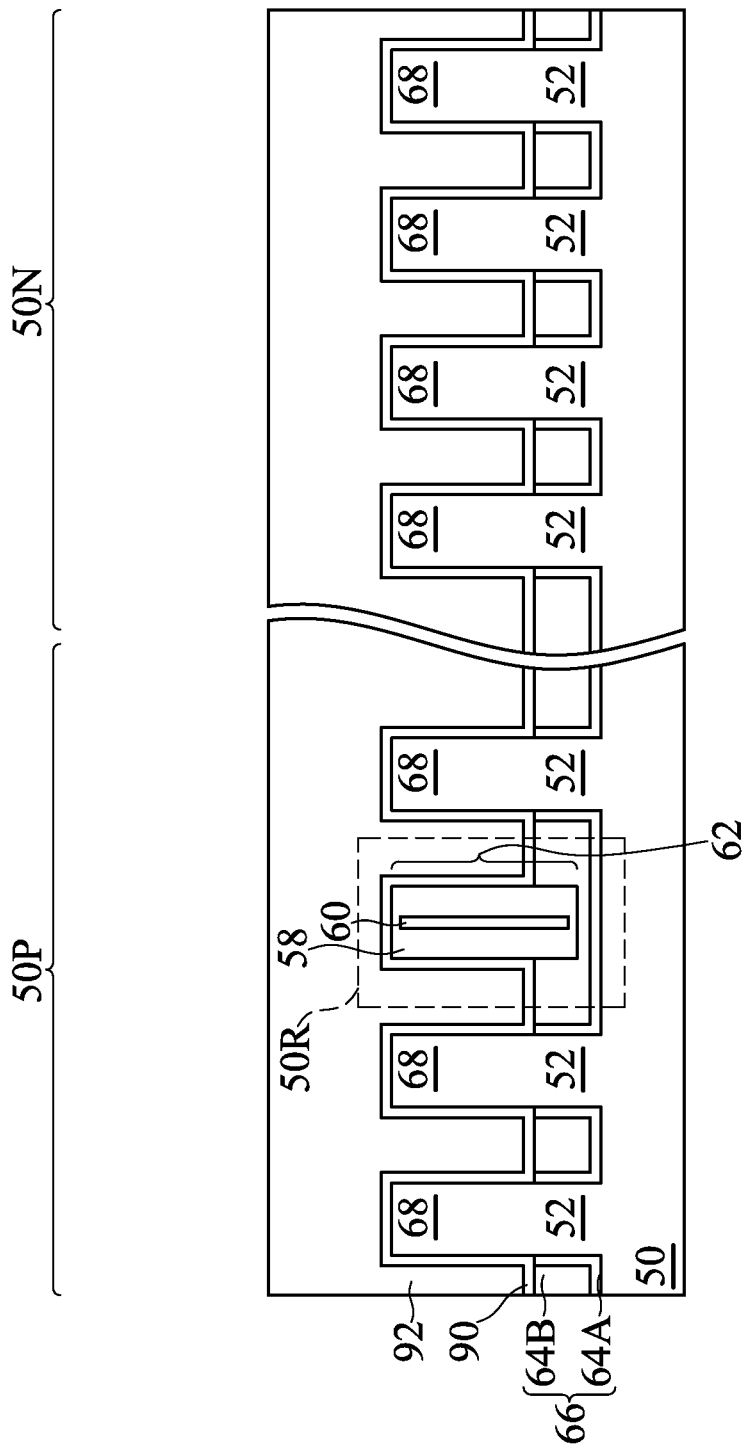
Figures 11B, 11C:
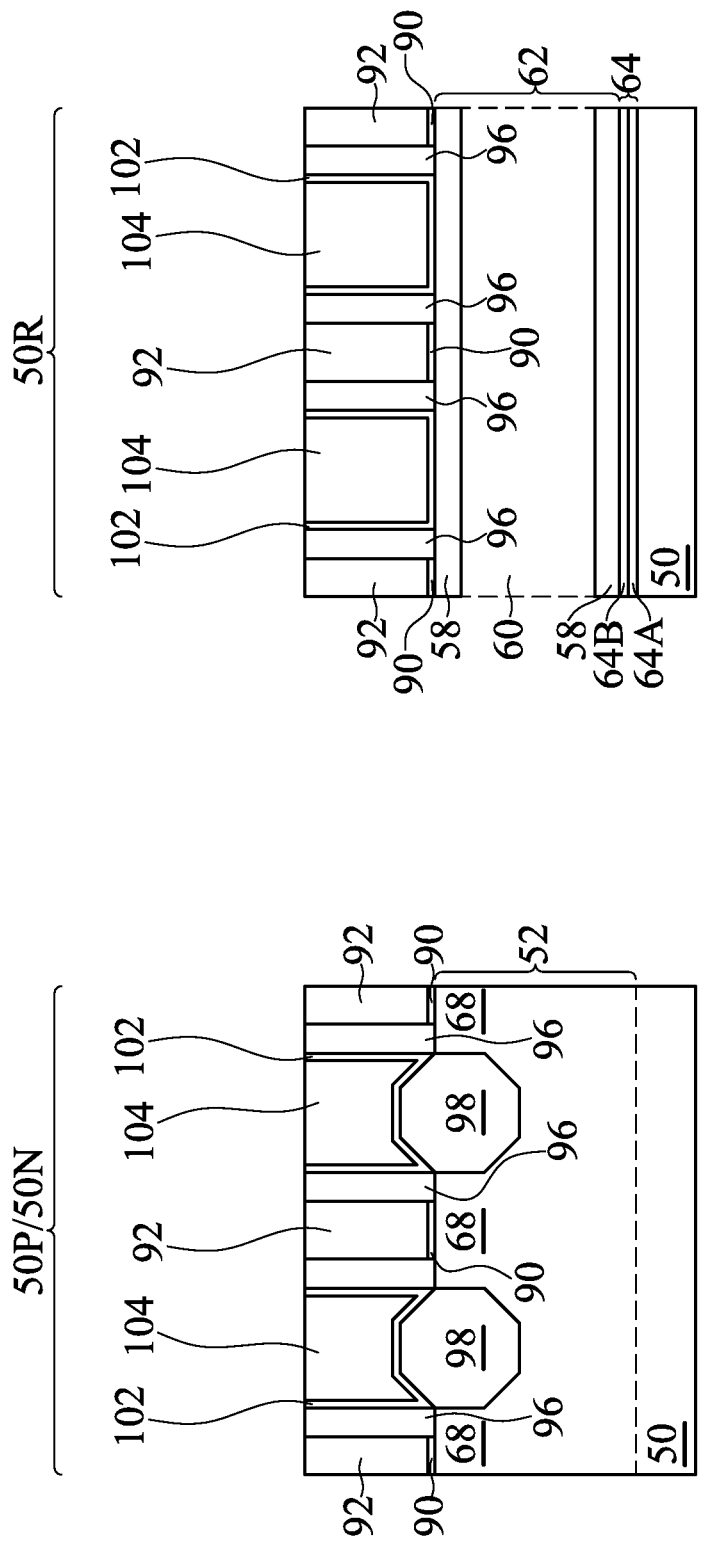

In FIGS. 11A through 11C, a planarization process, such as a CMP, may be performed to level the top surface of the first ILD layer 104 with the top surfaces of the dummy gates 92 or the masks 94 (if present). The dummy fin 62 helps reduce pattern loading effects during the planarization of the first ILD layer 104. The planarization process may also remove the masks 94 (if present) on the dummy gates 92, and portions of the gate spacers 96 along sidewalls of the masks 94. After the planarization process, top surfaces of the dummy gates 92, the gate spacers 96, and the first ILD layer 104 are level. Accordingly, the top surfaces of the dummy gates 92 are exposed through the first ILD layer 104. In some embodiments, the masks 94 may remain, in which case the planarization process levels the top surface of the first ILD layer 104 with the top surfaces of the masks 94.

Figure 12A:
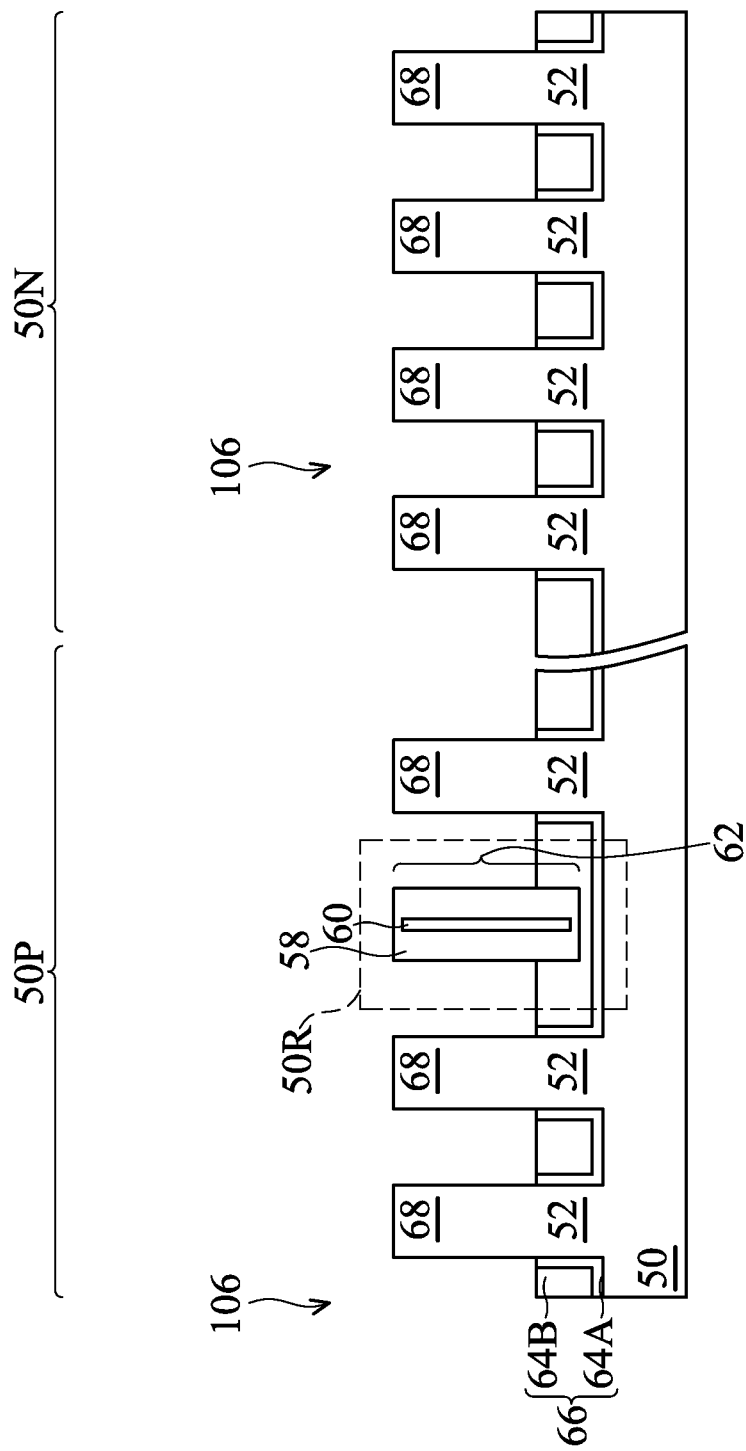
Figure 12C:
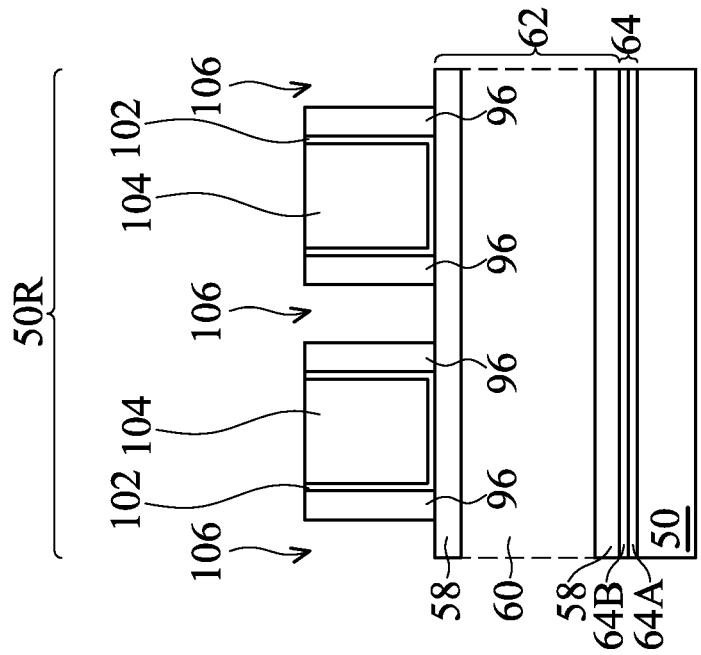
Figure 12B:
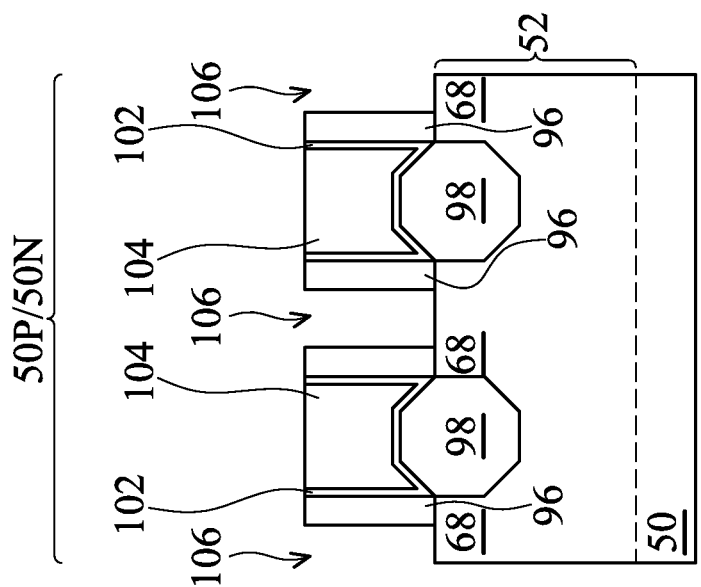

In FIGS. 12A through 12C, the dummy gates 92, and masks 94 (if present), are removed in one or more etching step(s), so that recesses 106 are formed. Portions of the dummy dielectrics 90 in the recesses 106 may also be removed. In some embodiments, only the dummy gates 92 are removed and the dummy dielectrics 90 remain and are exposed by the recesses 106. In some embodiments, the dummy dielectrics 90 are removed from recesses 106 in a first region of a die (e.g., a core logic region) and remain in recesses 106 in a second region of the die (e.g., an input/output region). In some embodiments, the dummy gates 92 are removed by an anisotropic dry etch process. For example, the etching process may include a dry etch process using reaction gas(es) that selectively etch the material of the dummy gates 92 at a faster rate than the materials of the first ILD layer 104, the gate spacers 96, and the dielectric layer 58. Each recess 106 exposes and/or overlies a channel region 68 of an active fin 52. Each channel region 68 is disposed between neighboring pairs of the epitaxial source/drain regions 98. Each recess 106 also exposes the top surface and sidewalls of the upper portion of the dummy fin 62 (e.g., the portion of the dummy fin 62 above the surfaces of the STI regions 66). During the removal, the dummy dielectrics 90 may be used as etch stop layers when the dummy gates 92 are etched. The dummy dielectrics 90 may then be optionally removed after the removal of the dummy gates 92.

Figure 13A:
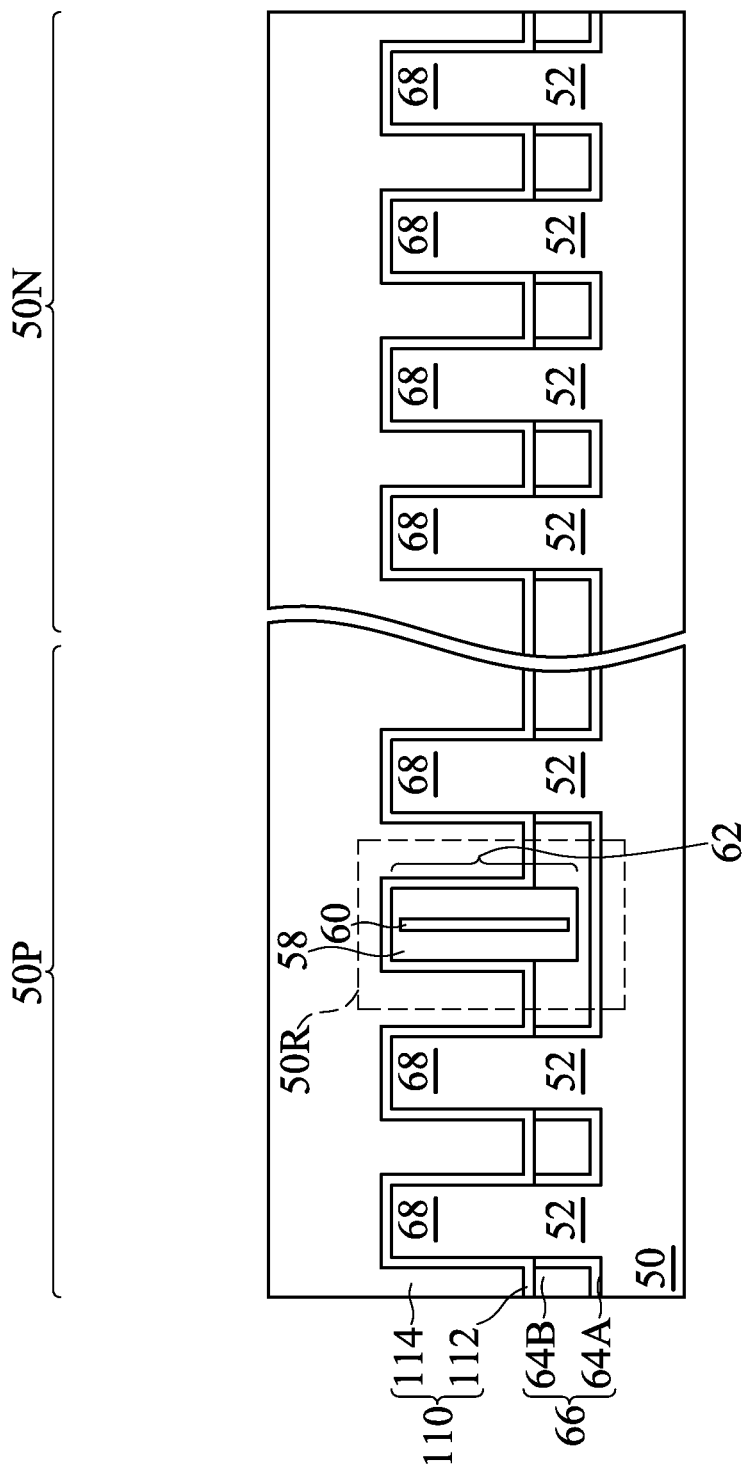
Figure 13C:
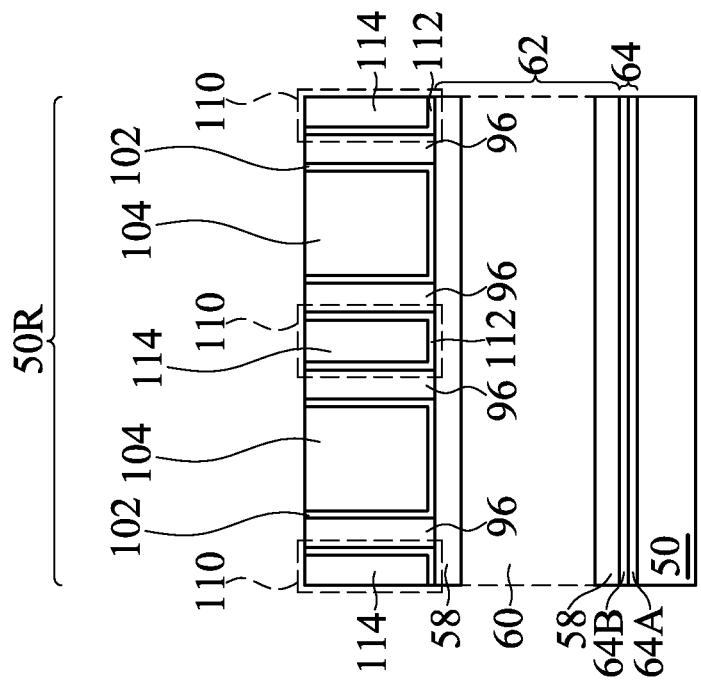
Figure 13B:
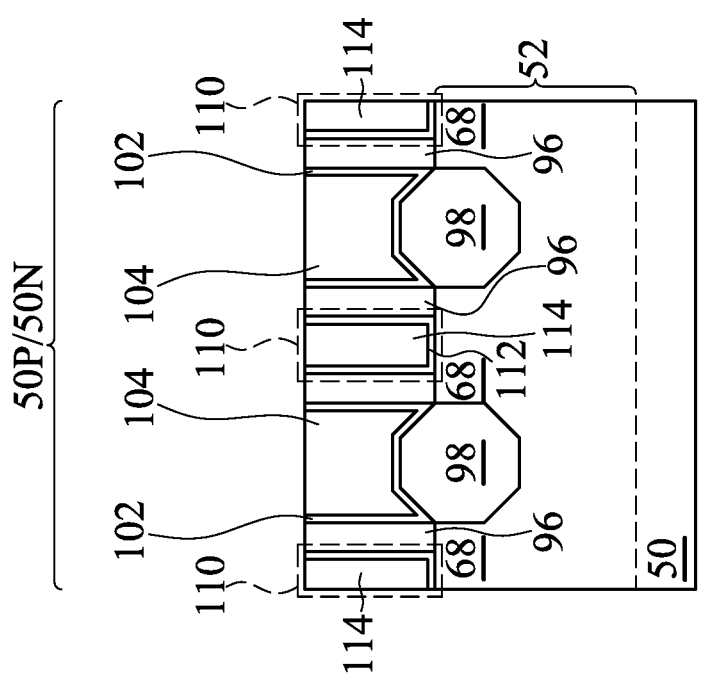

In FIGS. 13A through 13C, gate dielectrics 112 and gate electrodes 114 are formed for replacement gates. The gate dielectrics 112 are deposited in the recesses 106, such as on the top surfaces and the sidewalls of the active fins 52, on the top surface and the sidewalls of the dummy fin 62, and on the sidewalls of the gate spacers 96. The gate dielectrics 112 may also be formed on the top surface of the first ILD layer 104. In some embodiments, the gate dielectrics 112 include one or more dielectric layers, such as one or more layers of silicon oxide, silicon nitride, metal oxide, metal silicate, or the like. For example, in some embodiments, the gate dielectrics 112 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectrics 112 may include a dielectric layer having a k value greater than about 7.0. The formation methods of the gate dielectrics 112 may include Molecular-Beam Deposition (MBD), ALD, PECVD, and the like. In embodiments where portions of the dummy dielectrics 90 remain in the recesses 106, the gate dielectrics 112 include a material of the dummy dielectrics 90 (e.g., silicon oxide).

The gate electrodes 114 are deposited over the gate dielectrics 112, respectively, and fill the remaining portions of the recesses 106. The gate electrodes 114 may include a metal-containing material such as titanium nitride, titanium oxide, tantalum nitride, tantalum carbide, cobalt, ruthenium, aluminum, tungsten, combinations thereof, or multi-layers thereof. For example, although single layered gate electrodes 114 are illustrated, the gate electrodes 114 may include any number of liner layers, any number of work function tuning layers, and a fill material. After the filling of the recesses 106, a planarization process, such as a CMP, may be performed to remove the excess portions of the materials of the gate dielectrics 112 and the gate electrodes 114, which excess portions are over the top surface of the first ILD layer 104. The dummy fin 62 helps reduce pattern loading effects during the planarization of the gate dielectrics 112 and the gate electrodes 114. The remaining portions of material of the gate dielectrics 112 and the gate electrodes 114 thus form replacement gates of the resulting FinFETs. The gate dielectrics 112 and the gate electrodes 114 may be collectively referred to as gate structures 110 or "gate stacks." The gate structures 110 extend along the top surfaces and the sidewalls of the channel regions 68 of the active fins 52. The gate structures 110 also extend along the top surfaces and the sidewalls of the dummy fin 62.

The formation of the gate dielectrics 112 in the n-type region 50N and the p-type region 50P may occur simultaneously such that the gate dielectrics 112 in each region are formed from the same materials, and the formation of the gate electrodes 114 may occur simultaneously such that the gate electrodes 114 in each region are formed from the same materials. In some embodiments, the gate dielectrics 112 in each region may be formed by distinct processes, such that the gate dielectrics 112 may be different materials, and/or the gate electrodes 114 in each region may be formed by distinct processes, such that the gate electrodes 114 may be different materials. Various masking steps may be used to mask and expose appropriate regions when using distinct processes.

Figure 14A:
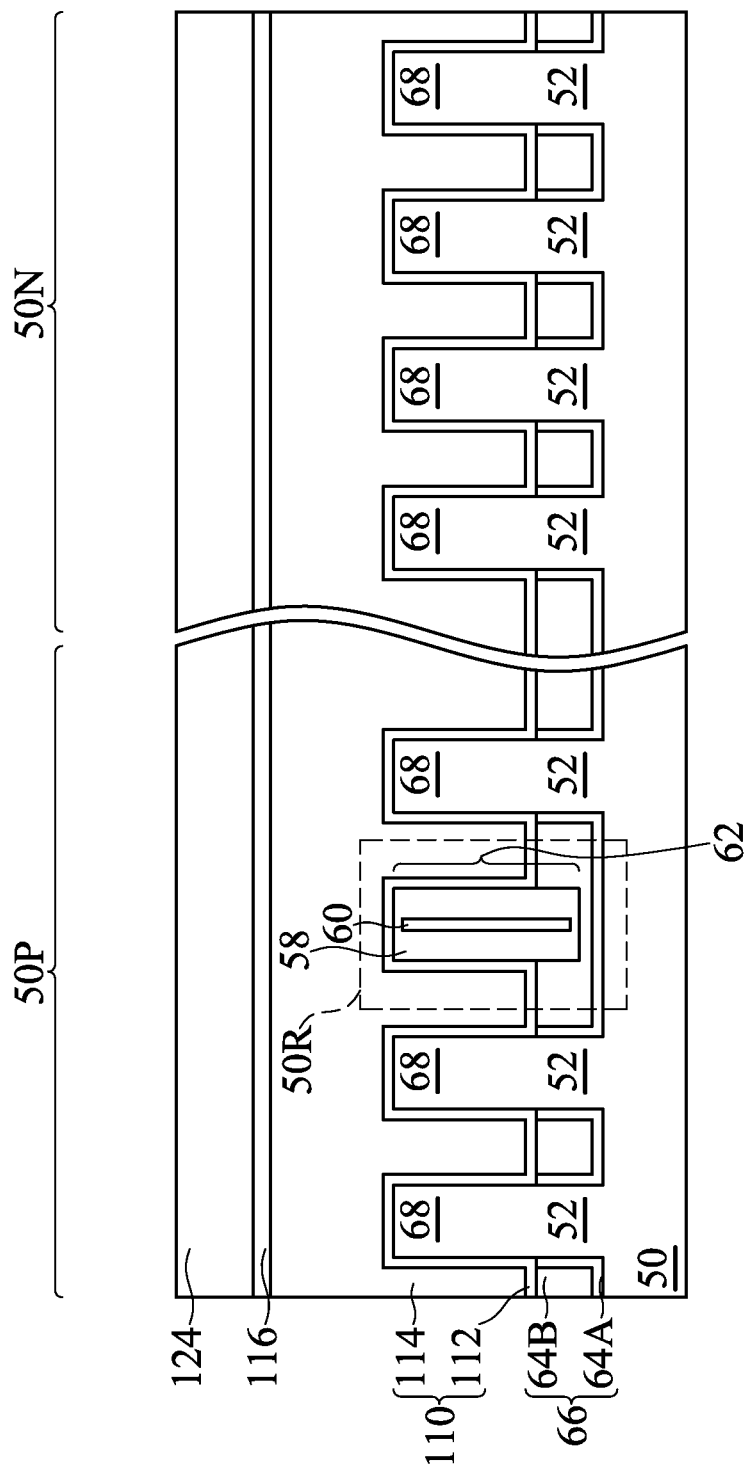
Figures 14B, 14C:
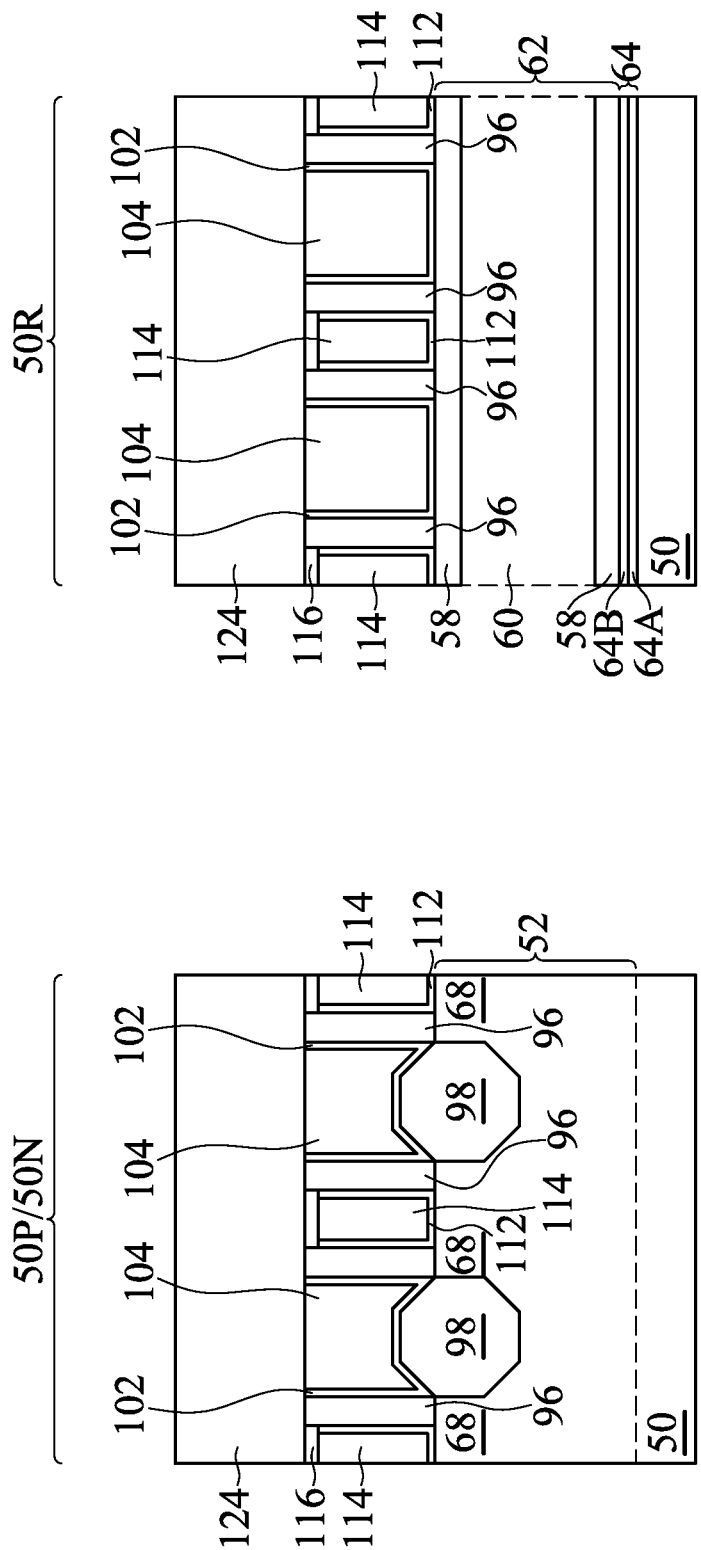

In FIGS. 14A through 14C, a second ILD layer 124 is deposited over the first ILD layer 104. The second ILD layer 124 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, the second ILD layer 124 is a flowable film formed by a flowable CVD method. In some embodiments, an etch stop layer (not shown) is disposed between the second ILD layer 124 and the first ILD layer 104. The etch stop layer may include a dielectric material, such as, silicon nitride, silicon oxide, silicon oxynitride, or the like, having a lower etch rate than the material of the second ILD layer 124.

In some embodiments, gate masks 116 are formed over respective gate structures (including a gate dielectric 112 and a corresponding gate electrode 114). The gate masks 116 are disposed between opposing pairs of the gate spacers 96. In some embodiments, the gate masks 116 are formed by recessing the gate dielectrics 112 and the gate electrodes 114 so that recesses are formed between opposing pairs of the gate spacers 96. One or more layers of dielectric material, such as silicon nitride, silicon oxynitride, or the like, are filled in the recesses, and a planarization process is performed to remove excess portions of the dielectric material extending over the first ILD layer 104. The gate masks 116 include the remaining portions of the dielectric material. Subsequently formed gate contacts penetrate through the second ILD layer 124 and the gate masks 116 to contact the top surface of the recessed gate electrodes 114.

Figure 15A:
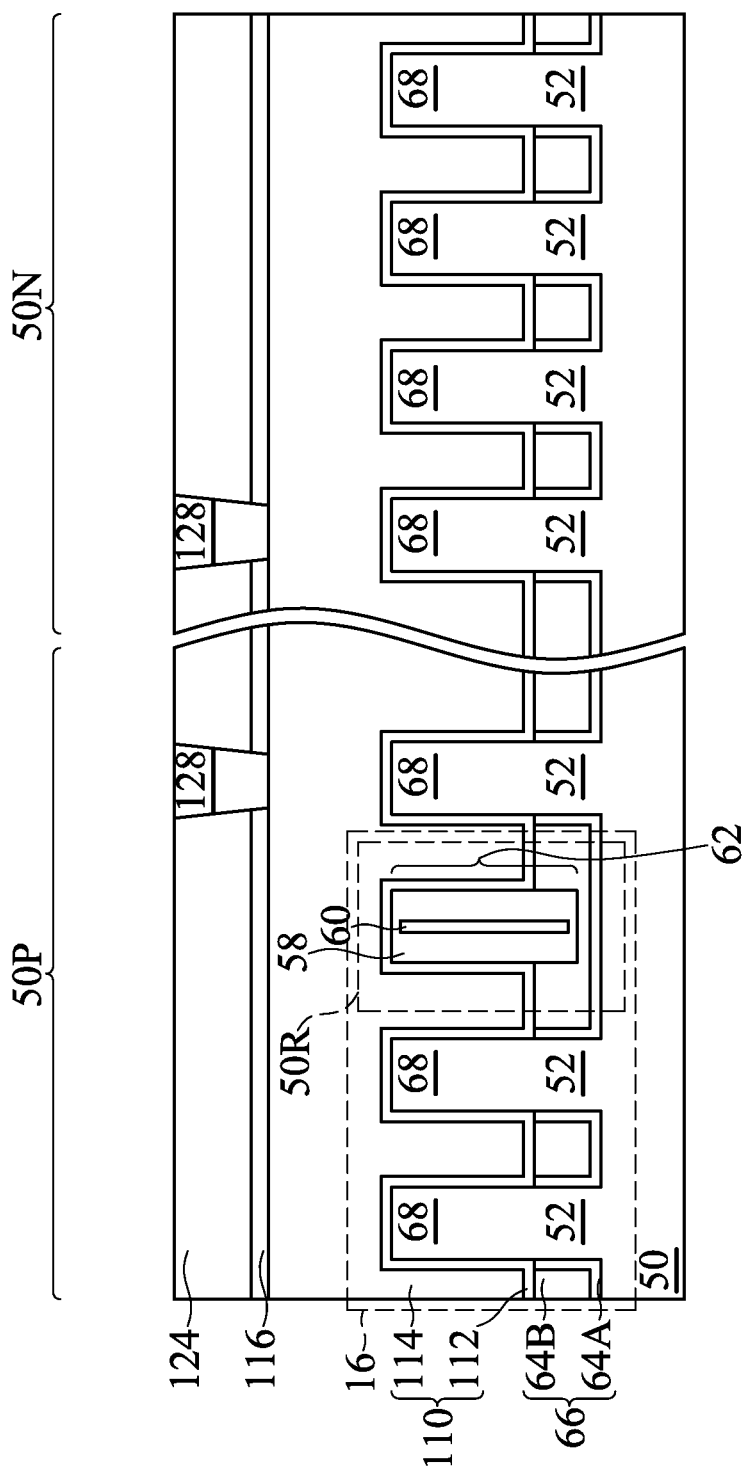

In FIGS. 15A through 15C, source/drain contacts 126 and gate contacts 128 are formed for, respectively, the epitaxial source/drain regions 98 and the gate electrodes 114. Openings for the source/drain contacts 126 are formed through the second ILD layer 124, the first ILD layer 104, and the CESL 102. Openings for the gate contacts 128 are formed through the second ILD layer 124 and the gate masks 116. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from the top surface of the second ILD layer 124. The dummy fin 62 helps reduce pattern loading effects during the planarization of the second ILD layer 124. The remaining liner and conductive material form the source/drain contacts 126 and the gate contacts 128 in the openings. An anneal process may be performed to form a silicide at the interface between the epitaxial source/drain regions 98 and the source/drain contacts 126. The source/drain contacts 126 are physically and electrically coupled to the epitaxial source/drain regions 98, and the gate contacts 128 are physically and electrically coupled to the gate electrodes 114. The source/drain contacts 126 and the gate contacts 128 may be formed in different processes, or may be formed in the same process. Although shown as being formed in the same cross-sections, it should be appreciated that each of the source/drain contacts 126 and the gate contacts 128 may be formed in different cross-sections, which may avoid shorting of the contacts.

Figure 16:
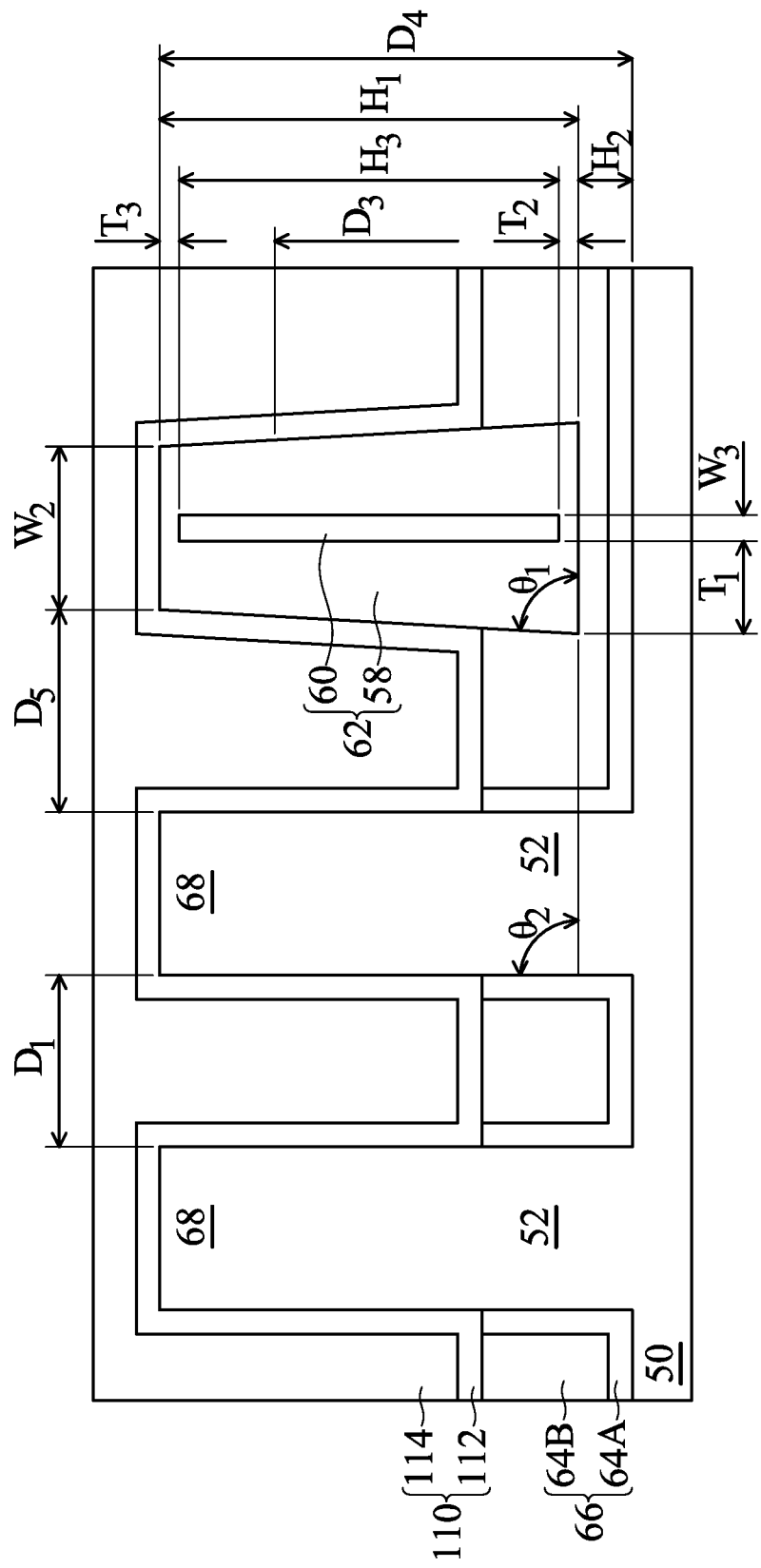
FIG. 16 is a cross-sectional view of FinFETs, in accordance with some embodiments.

FIG. 16 is a detailed view of a region 16 from FIG. 15A. The shape and dimensions of the dummy fin 62 are more clearly illustrated. The dummy fin 62 and the void 60 both have a similar profile shape as the recess 56 (see FIG. 5), e.g., a reentrant profile shape. As such, the sidewalls of the dummy fin 62 form an angle $\theta_1$ with a plane parallel to a major surface of the substrate 50. The angle $\theta_1$ can be in the range of about 75 degrees to about 100 degrees. In some embodiments, the angle $\theta_1$ is an acute angle. In contrast, the sidewalls of the active fins 52 form an angle $\theta_2$ with a plane parallel to a major surface of the substrate 50. The angle $\theta_2$ can be in the range of about 80 degrees to about 90 degrees. In some embodiments, the angle $\theta_1$ is less than the angle $\theta_2$. For example, the angle $\theta_1$ can be from about 0% to about 10% less than the angle $\theta_2$.

Because the angle $\theta_1$ is acute, the width $W_2$ of the dummy fin 62 decreases along the direction $D_3$ extending away from the substrate 50. The width $W_2$ of the dummy fin 62 can be in the range of about 10 nm to about 40 nm, and the width $W_2$ at the bottom of the dummy fin 62 can be from about 0% to about 30% greater than the width $W_2$ at the top of the dummy fin 62. Likewise, the width $W_3$ of the void 60 decreases along the direction $D_3$. The width $W_3$ of the void 60 can be in the range of about 1.5 nm to about 2.5 nm, and the width $W_3$ at the bottom of the void 60 can be from about 0% to about 30% greater than the width $W_3$ at the top of the void 60.

As noted above, the top surfaces of the dummy fin 62 and the active fins 52 are disposed a same distance from the substrate 50. Specifically, the top surfaces of the dummy fin 62 and the active fins 52 are disposed a distance $D_4$ from the substrate 50, where the distance $D_4$ can be in the range of about 73 nm to about 85 nm. The dummy fin 62 has an overall height $H_1$, which can be in the range of about 48 nm to about 60 nm. The dummy fin 62 extends into the STI regions 66, e.g., the STI regions 66 have a portion that is disposed between the dummy fin 62 and the substrate 50, and the STI regions 66 extend along sidewalls of the lower portions of the dummy fin 62 and the active fins 52. The portion of the STI regions 66 between the dummy fin 62 and the substrate 50 has a height $H_2$, which can be in the range of about 15 nm to about 35 nm. The distance $D_4$ equals the sum of the height $H_1$ and the height $H_2$.

The dielectric layer 58 has a thickness $T_1$ along sidewalls of the void 60, which can be in the range of about 5 nm to about 20 nm. The dielectric layer 58 has a thickness $T_2$ along the bottom of the void 60, which can be in the range of about 2 nm to about 20 nm. The dielectric layer 58 has a thickness $T_3$ along the top of the void 60, which can be in the range of about 0 nm to about 20 nm. The thickness $T_2$ and the thickness $T_3$ are small, such that the void 60 has a large height $H_3$, which can be in the range of about 48 nm to about 60 nm. In some embodiments, the height $H_3$ is from about 70% to about 98% of the overall height $H_1$ of the dummy fin 62. The height $H_1$ equals the sum of the height $H_3$, the thickness $T_2$, and the thickness $T_3$.

As noted above, the dummy fin 62 is equidistantly spaced from adjacent active fins 52. Specifically, the dummy fin 62 is spaced apart from adjacent active fins 52 by a distance $D_5$, which can be in the range of about 10 nm to about 40 nm. In some embodiments, the distance $D_5$ equals the distance $D_1$ between adjacent active fins 52. In some embodiments, the distance $D_5$ is not equal to the distance $D_1$; for example, the distance $D_5$ can be from about 5% to about 30% greater than distance $D_1$.

FIGS. 17 through 24 are cross-sectional views of intermediate stages in the manufacturing of FinFETs, in accordance with some other embodiments. In this embodiment, the dummy fin 62 includes a plurality of dielectric layers 58A, 58B, 58C (see FIG. 22) and a void 60, where the dielectric layers 58A, 58B, 58C in combination surround the void 60. FIGS. 17 through 24 illustrate reference cross-section A-A illustrated in FIG. 1, except for multiple fins/FinFETs.

Figure 17:
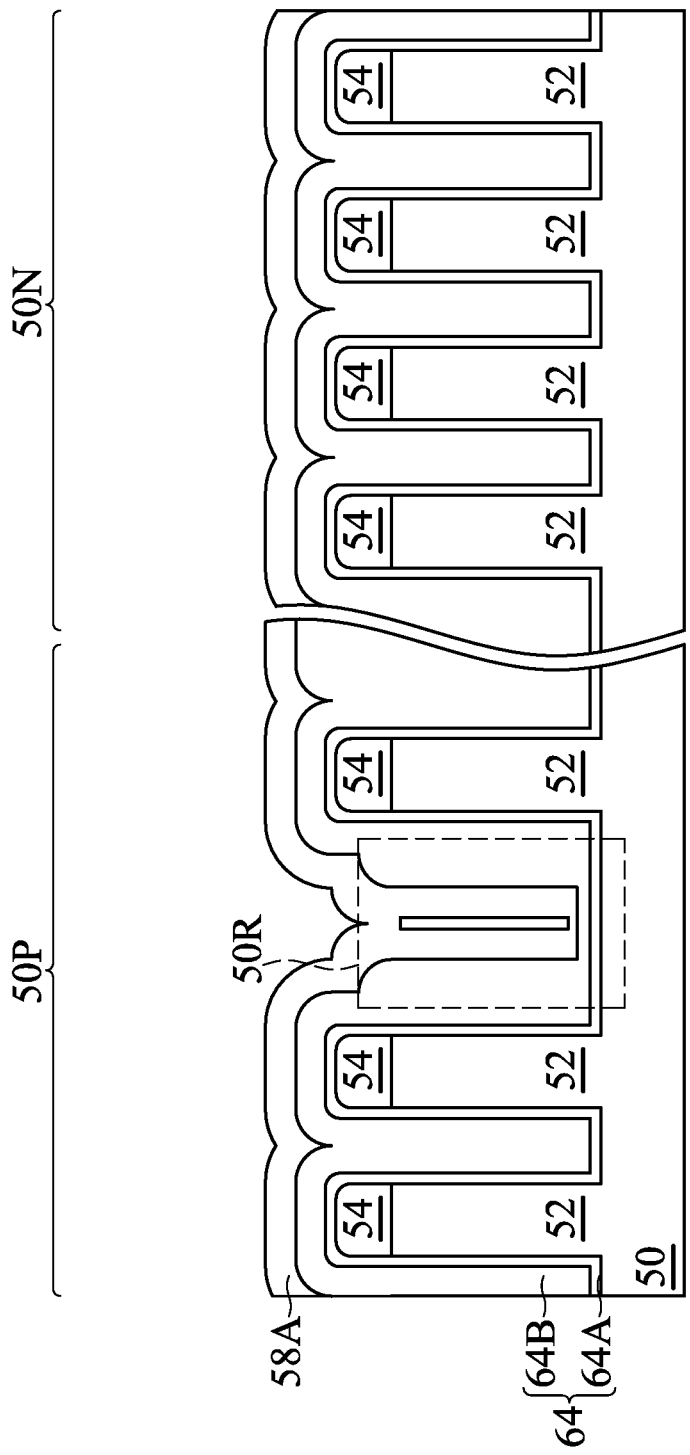
FIGS. 17, 18, 19, 20, 21, 22, 23, and 24 are cross-sectional views of intermediate stages in the manufacturing of FinFETs, in accordance with some embodiments.

In FIG. 17, a structure similar to that shown in FIG. 3 is obtained. A first dielectric layer 58A is then formed on the insulation material 64 and in the recess 56. The first dielectric layer 58A may be formed of silicon oxynitride, silicon oxycarbonitride, silicon nitride, or the like, and may be formed by ALD, CVD, or the like. The first dielectric layer 58A is formed of a material that has a high etching selectivity from the etching of the insulation material 64. Further, the material of the first dielectric layer 58A has a greater relative permittivity than the material(s) of the insulation material 64. For example, the insulation material 64 can be formed of a material that has a relative permittivity in the range of about 10 to about 12 and the first dielectric layer 58A can be formed of a material that has a relative permittivity in the range of about 4 to about 7. In some embodiments, the first dielectric layer 58A is silicon oxynitride formed by ALD. In another embodiment, the material of the first dielectric layer 58A has a lesser relative permittivity than the material(s) of the insulation material 64.

Figure 18:
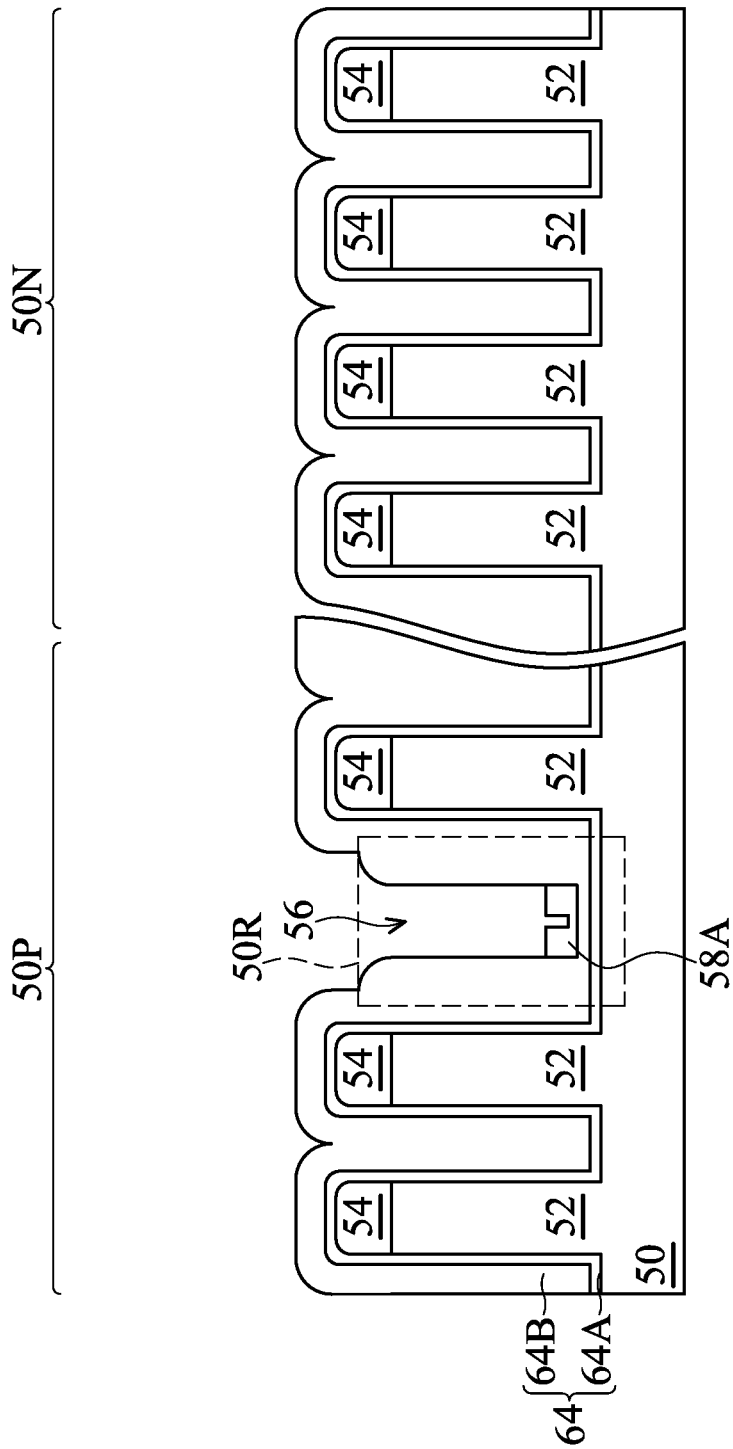

In FIG. 18, an etchback process is performed to remove portions of the first dielectric layer 58A outside of the recess 56 and to recess portions of the first dielectric layer 58A inside the recess 56. The etchback may be by an acceptable etching process, such as one that selectively etches the material of the first dielectric layer 58A at a faster rate than the material(s) of the insulation material 64. As discussed further below with respect to FIGS. 25A and 25B, after the etchback process, the top surfaces of the first dielectric layer 58A can be flat or can be angled.

Figure 19:
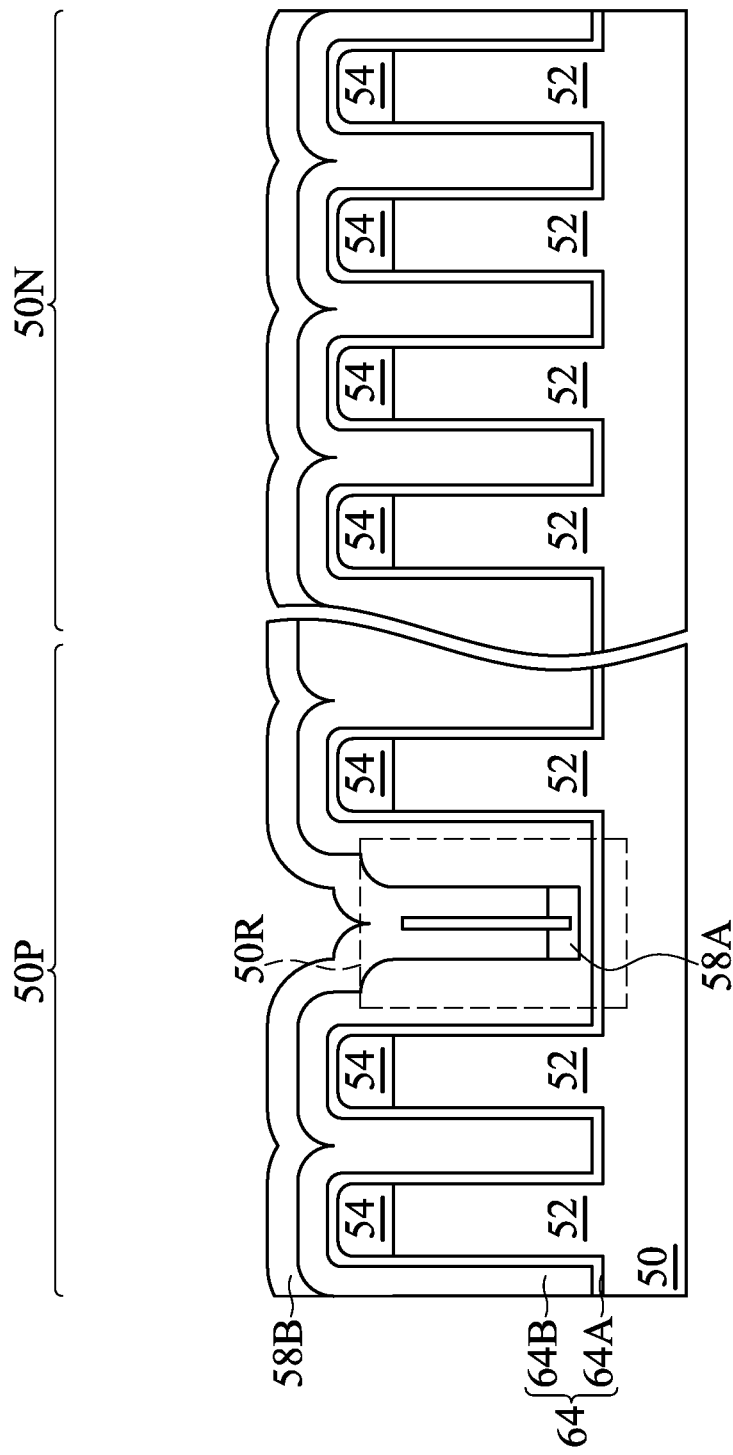

In FIG. 19, a second dielectric layer 58B is formed on the first dielectric layer 58A and the insulation material 64. The second dielectric layer 58B may be formed of a high-k dielectric material such as a metal oxide or a silicate of hafnium, aluminum, zirconium, lanthanum, manganese, barium, titanium, lead, and combinations thereof, and may be formed by ALD, CVD, or the like. The second dielectric layer 58B is formed of a material that has a high etching selectivity from the etching of the first dielectric layer 58A and the insulation material 64. Further, the material of the second dielectric layer 58B has a greater relative permittivity than the material of the first dielectric layer 58A. For example, the second dielectric layer 58B can be formed of a material that has a relative permittivity in the range of about 7 to about 35. In some embodiments, the second dielectric layer 58B is hafnium oxide formed by ALD.

Figure 20:
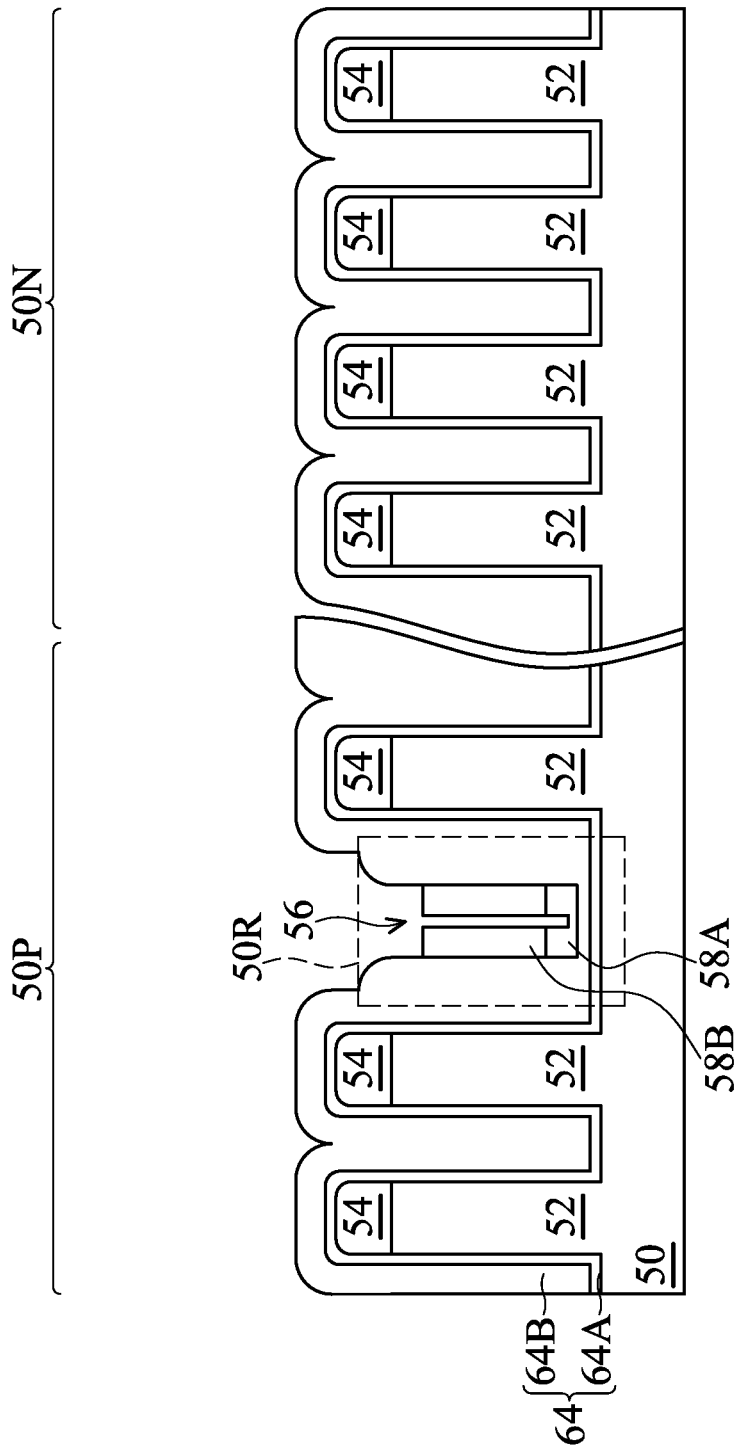

In FIG. 20, an etchback process is performed to remove portions of the second dielectric layer 58B outside of the recess 56 and to recess portions of the second dielectric layer 58B inside the recess 56. The etchback may be by an acceptable etching process, such as one that selectively etches the material of the second dielectric layer 58B at a faster rate than the material(s) of the first dielectric layer 58A and the insulation material 64. As discussed further below with respect to FIGS. 25A and 25B, after the etchback process, the top surfaces of the second dielectric layer 58B can be flat or can be angled.

Figure 21:
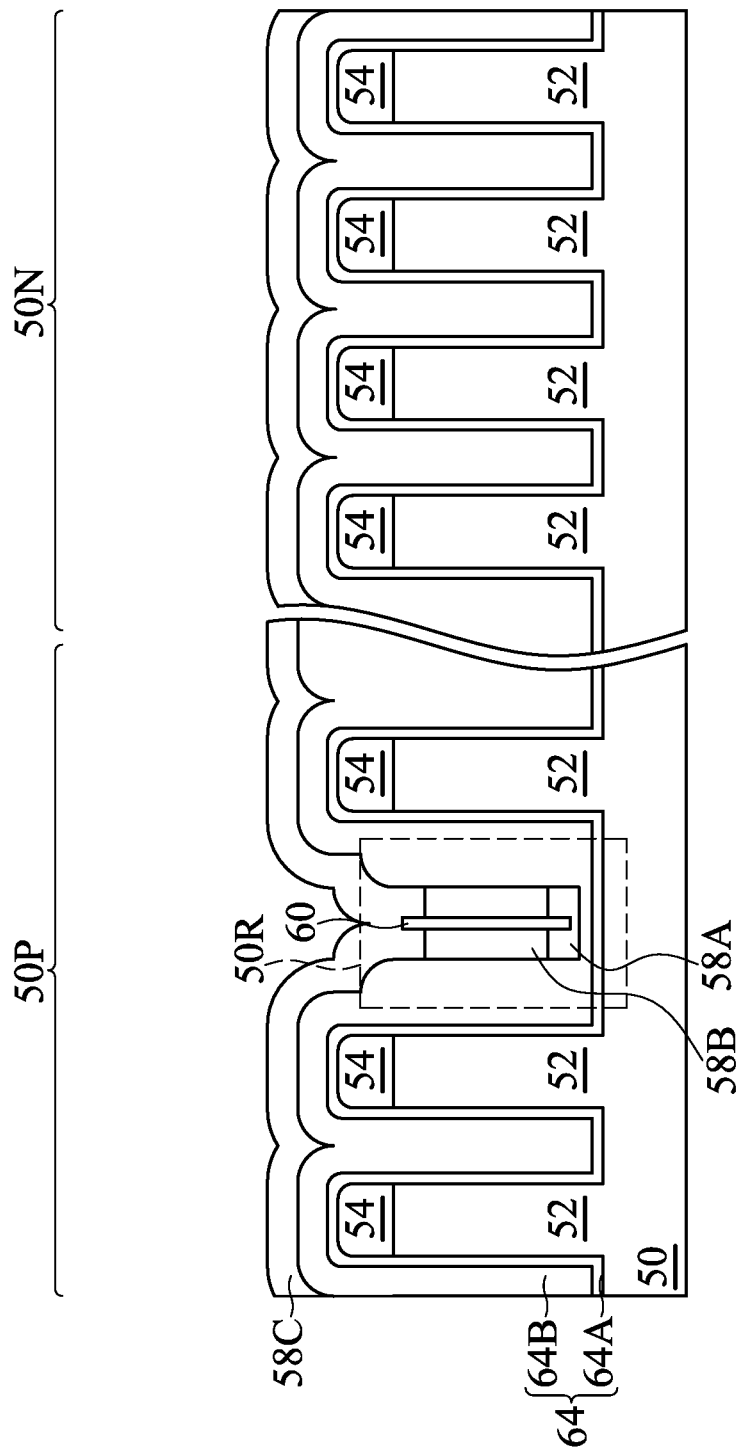

In FIG. 21, a third dielectric layer 58C is formed on the second dielectric layer 58B and the insulation material 64. The third dielectric layer 58C may be formed of silicon oxynitride, silicon oxycarbonitride, silicon nitride, or the like, and may be formed by ALD, CVD, or the like. The third dielectric layer 58C is formed of a material that has a high etching selectivity from the etching of the second dielectric layer 58B and the insulation material 64. Further, the material of the third dielectric layer 58C has a lesser relative permittivity than the material of the second dielectric layer 58B. For example, the third dielectric layer 58C can be formed of a material that has a relative permittivity in the range of about 4 to about 7. In some embodiments, the third dielectric layer 58C is silicon oxynitride formed by ALD. The first dielectric layer 58A and the third dielectric layer 58C can be similar or can be different. In some embodiments, the first dielectric layer 58A and the third dielectric layer 58C are each formed of silicon oxynitride with different oxygen and nitrogen compositions.

Figure 22:
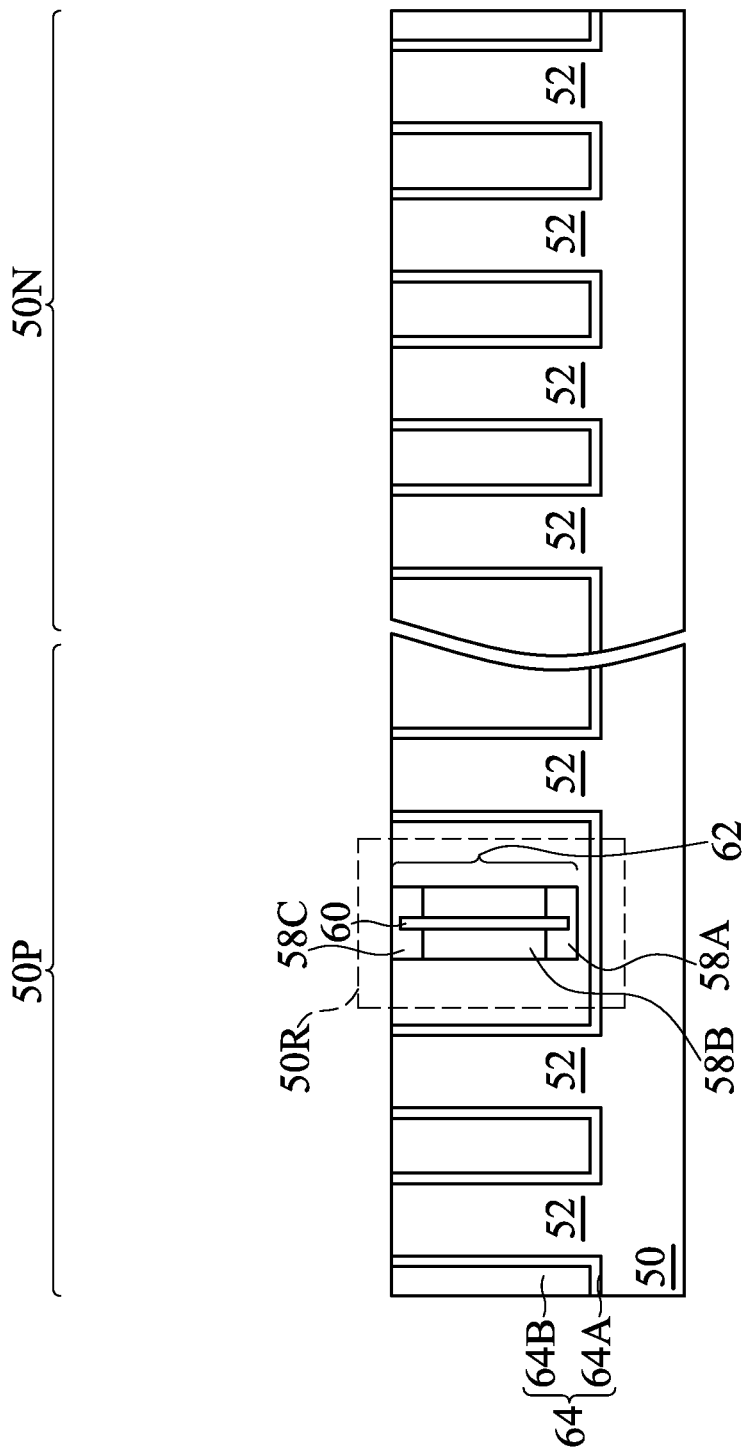

In FIG. 22, a removal process is applied to the third dielectric layer 58C and the insulation material 64 to remove excess portions of the third dielectric layer 58C and the insulation material 64 over the active fins 52. In some embodiments, a planarization process such as a chemical mechanical polish (CMP), an etch-back process, combinations thereof, or the like may be utilized. The removal process forms a dummy fin 62, which includes the remaining portions of the dielectric layers 58A, 58B, 58C in the recess 56. The dummy fin 62 includes a void 60. The first dielectric layer 58A surrounds a lower portion of the void 60, the second dielectric layer 58B surrounds a middle portion of the void 60, and third dielectric layer 58C surrounds an upper portion of the void 60.

The dielectric layers 58A, 58B, 58C are formed of dielectric materials having different relative permittivities. In some embodiments, the materials of each of the dielectric layers 58A, 58B, 58C have a greater relative permittivity than the material(s) of the insulation material 64. The dielectric layers 58A, 58B, 58C and the void 60 act as dielectric mediums for a network of parasitic capacitors disposed between the active fins 52 that border the inactive region 50R. Forming the dielectric layers 58A, 58B, 58C of dielectric materials having different relative permittivities can help decrease the effective capacitance of the capacitor network by from about 11% to about 20%. The parasitic capacitance of the resulting FinFETs may thus be further reduced, thereby increasing the performance of the FinFETs.

Figure 23:
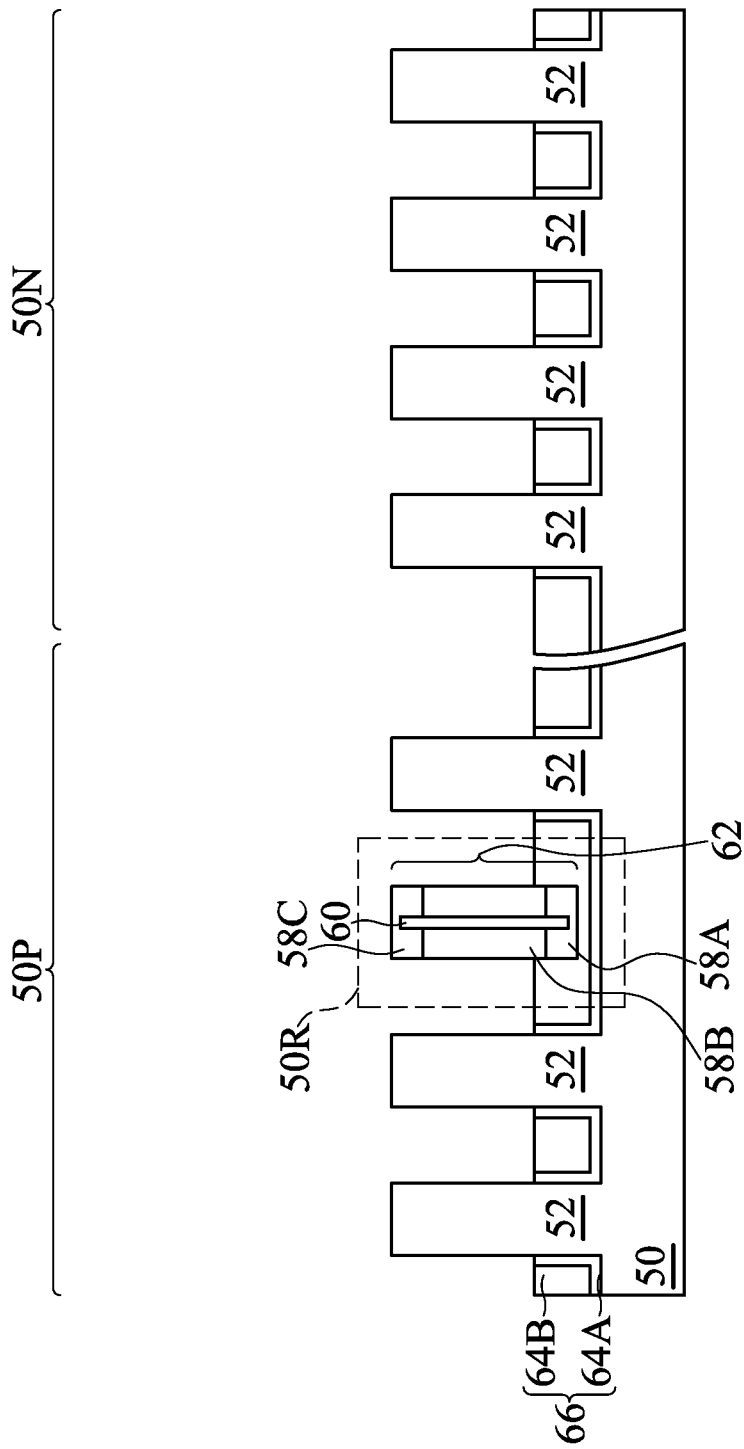

In FIG. 23, the insulation material 64 is recessed to form STI regions 66. The insulation material 64 is recessed such that upper portions of the active fins 52 and the dummy fin 62 protrude above and from between neighboring STI regions 66. The STI regions 66 may be recessed using an acceptable etching process, such as one that is selective to the material(s) of the insulation material 64. Each of the dielectric layers 58A, 58B, 58C is formed of a material that has a high etching selectivity from the etching of the insulation material 64. For example, an oxide removal using, for example, dilute hydrofluoric (dHF) acid may be used. The etching process selectively etches the material(s) of the insulation material 64 at a faster rate than the material(s) of the active fins 52 and the dummy fin 62. For example, the materials of each of the dielectric layers 58A, 58B, 58C and the material(s) of the insulation material 64 can have an etch selectivity in the range of about 20:1 to about 1000:1, relative the etching process for recessing the insulation material 64. The dielectric layers 58A, 58B, 58C may thus be protected from damage during formation of the dummy fin 62. In some embodiments, the dielectric layers 58B, 58C have a lesser etch rate than the first dielectric layer 58A, relative the etching process for recessing the insulation material 64. For example, in the illustrated embodiment, the first dielectric layer 58A remains buried after the STI regions 66 are formed, and thus may not be etched during the recessing of the insulation material 64.

Figure 24:
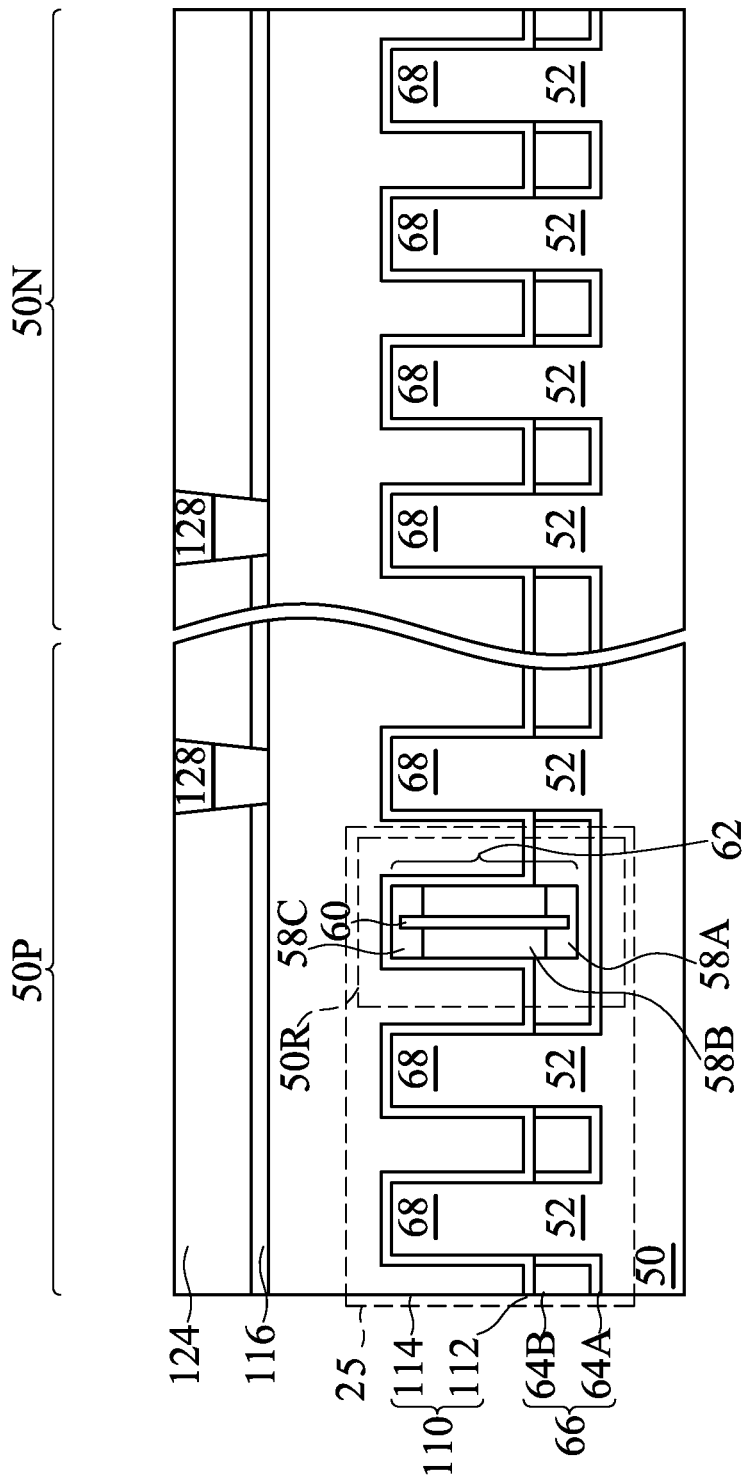

In FIG. 24, processing steps similar to those described with respect to FIGS. 8 through 15C may be performed. Formation of the FinFETs may thus be completed.

Figure 25A:
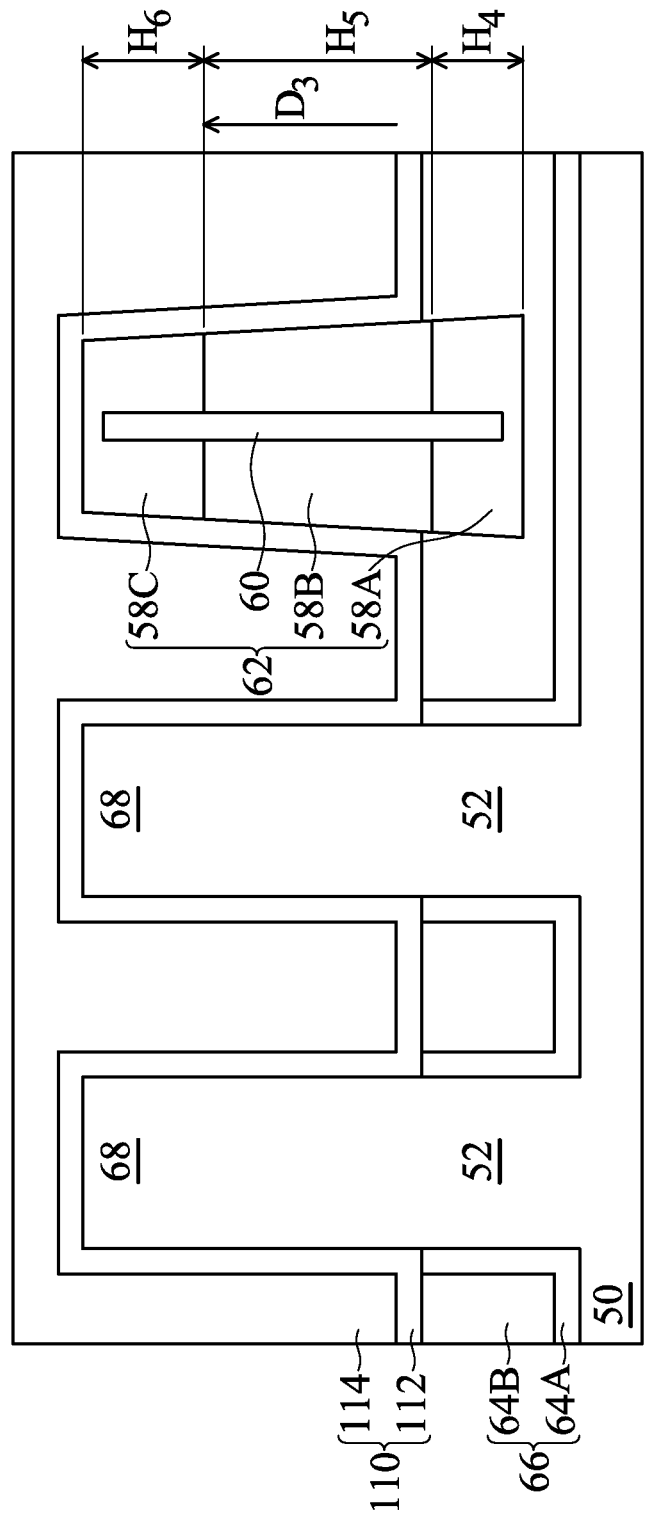
FIGS. 25A and 25B are cross-sectional views of FinFETs, in accordance with some other embodiments.
Figure 25B:
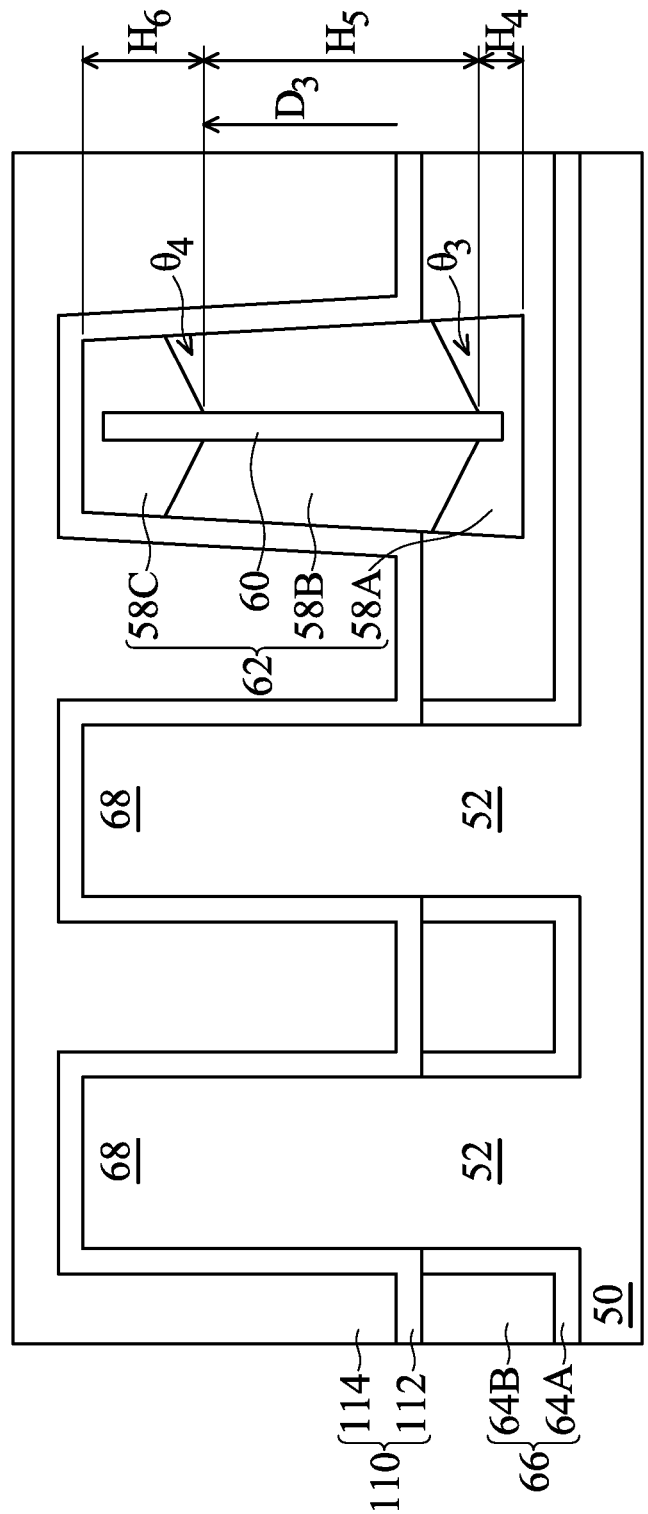

FIGS. 25A and 25B are detailed views of a region 25 from FIG. 24, in accordance with various embodiments. The shape and dimensions of the dummy fin 62 are more clearly illustrated. The dummy fin 62 and the void 60 both have a similar profile shape and dimensions as the embodiment described with respect to FIG. 16. The dielectric layers 58A, 58B, 58C each have different heights. The first dielectric layer 58A can have a height $H_4$ in the range of about 8 nm to about 30 nm, the second dielectric layer 58B can have a height $H_5$ in the range of about 10 nm to about 50 nm, and the third dielectric layer 58C can have a height $H_6$ in the range of about 2 nm to about 8 nm. The height $H_5$ can be greater than each of the height $H_4$ and the height $H_6$. In some embodiments, the second dielectric layer 58B has a reentrant profile shape, as illustrated by FIG. 25A. When the second dielectric layer 58B has a reentrant profile shape, the top surfaces and the bottom surfaces of the second dielectric layer 58B are parallel to the major surface of the substrate 50. In some embodiments, the second dielectric layer 58B has a chevron profile shape, as illustrated by FIG. 25B. When the second dielectric layer 58B has a chevron profile shape the bottom surfaces of the second dielectric layer 58B each form an acute angle $\theta_3$ with a plane parallel to a major surface of the substrate 50, and the top surfaces of the second dielectric layer 58B also each form an acute angle $\theta_4$ with a plane parallel to a major surface of the substrate 50. The angles $\theta_3$ and $\theta_4$ can each be up to about 50 degrees. In some embodiments, the angles $\theta_3$ are less than the angles $\theta_4$.

Figure 26:
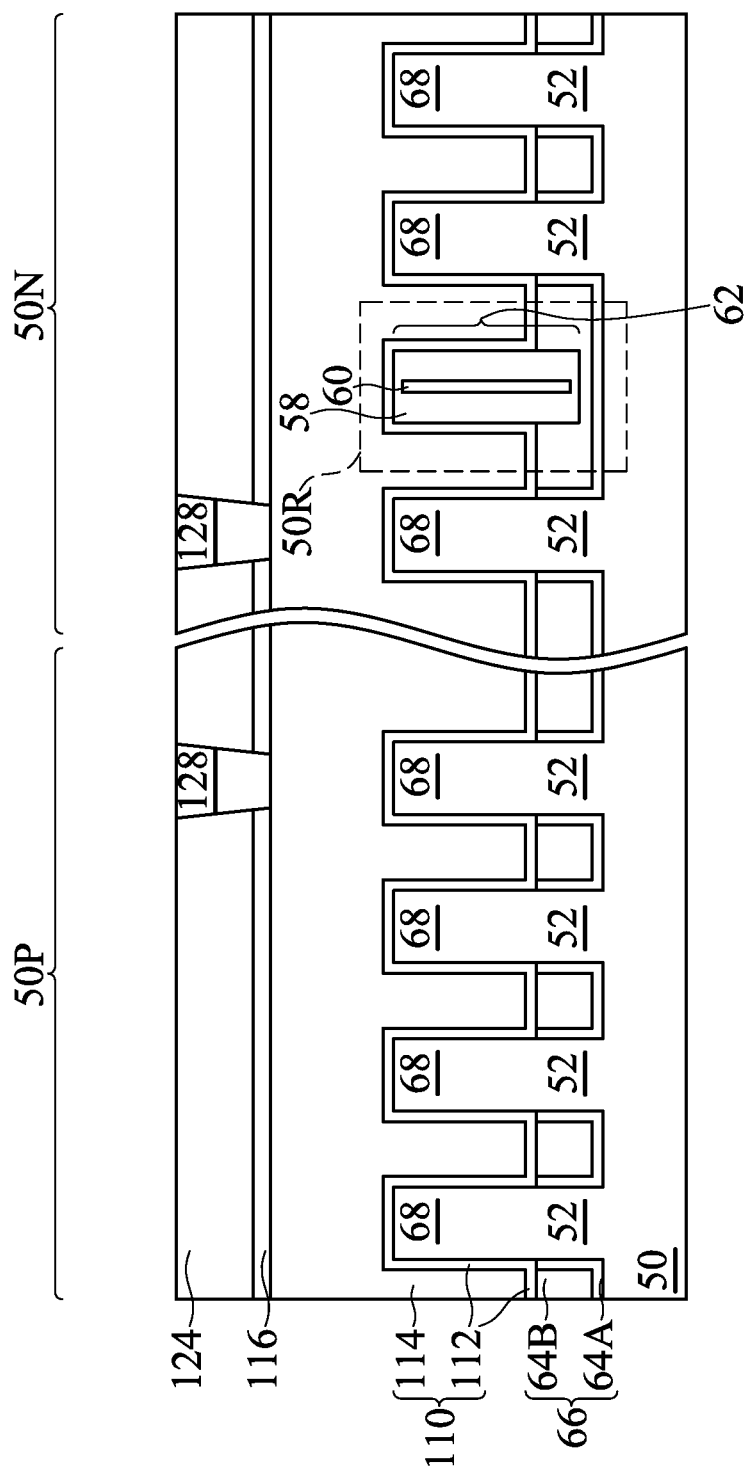
FIGS. 26 and 27 are cross-sectional views of FinFETs, in accordance with some other embodiments.

FIG. 26 is a cross-sectional view of FinFETs, in accordance with some other embodiments. FIG. 26 illustrates reference cross-section A-A illustrated in FIG. 1, except for multiple fins/FinFETs. In this embodiment, the inactive region 50R is part of the n-type region 50N, and is disposed between adjacent n-type FinFETs in the n-type region 50N. The inactive region 50R includes a dummy fin 62, which can be similar to any of the dummy fins described with respect to FIGS. 16, 25A, and 25B.

Figure 27:
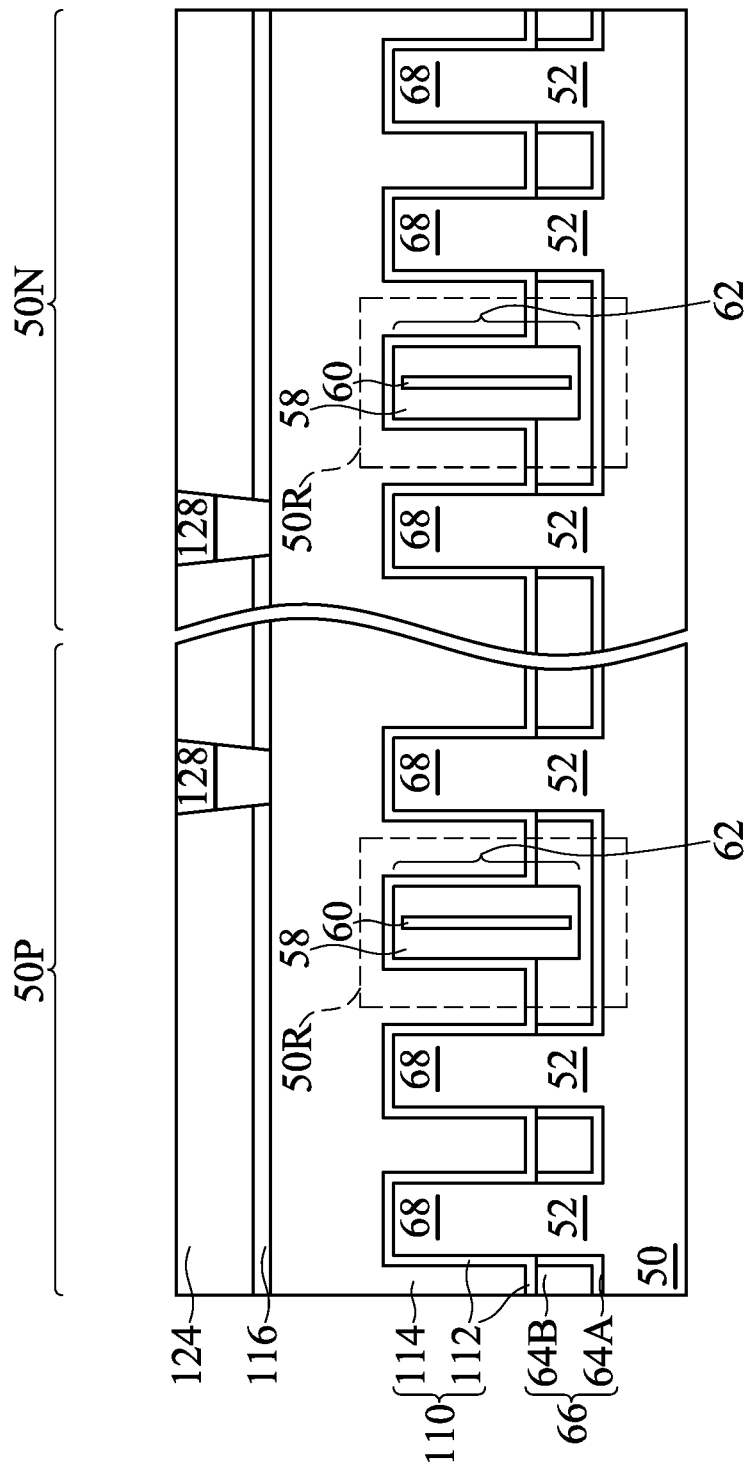

FIG. 27 is a cross-sectional view of FinFETs, in accordance with some other embodiments. FIG. 27 illustrates reference cross-section A-A illustrated in FIG. 1, except for multiple fins/FinFETs. In this embodiment, the n-type region 50N and the p-type region 50P both include inactive regions 50R. The inactive regions 50R each include a dummy fin 62, which can be similar to any of the dummy fins described with respect to FIGS. 16, 25A, and 25B.

Figure 28:
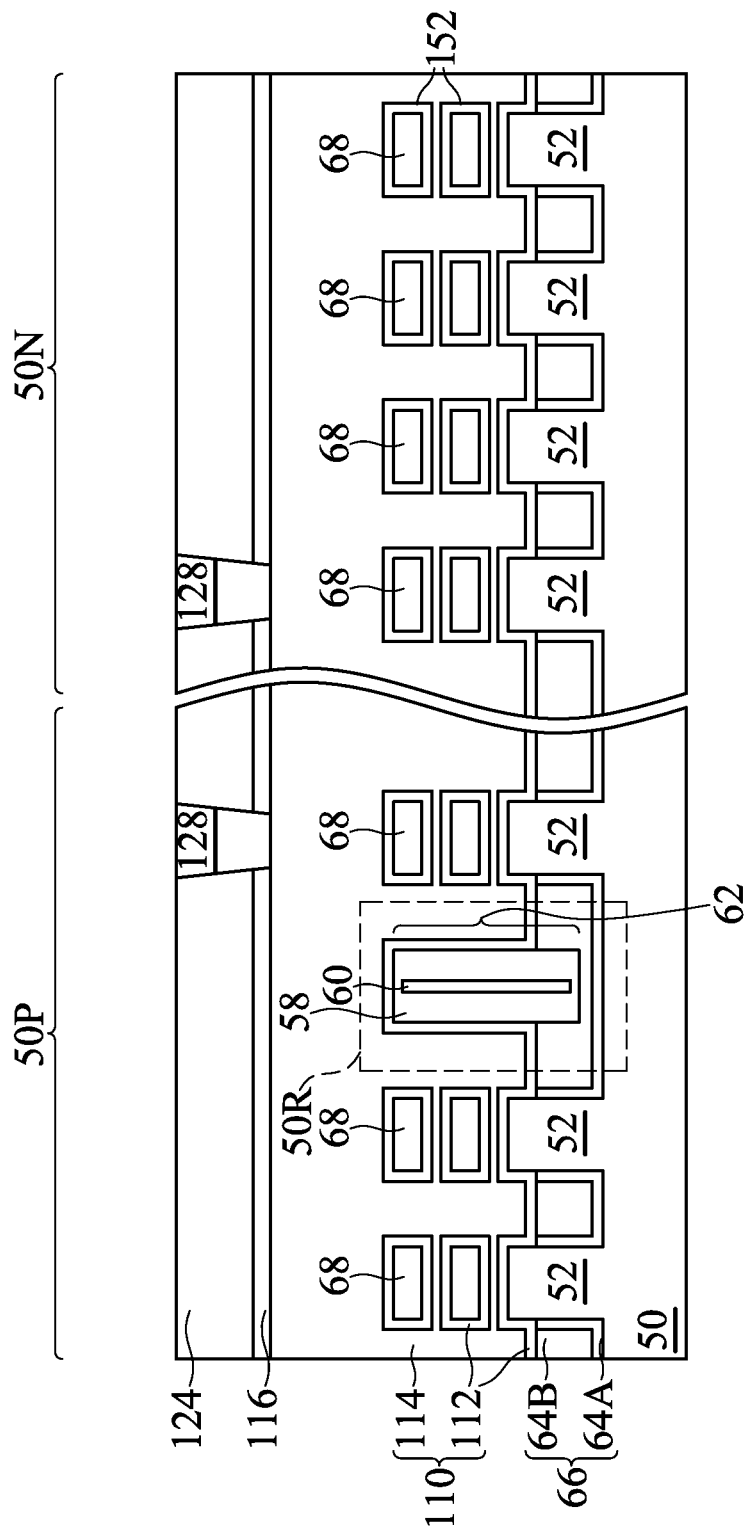
FIG. 28 is a cross-sectional view of NSFETs, in accordance with some embodiments.

The disclosed FinFET embodiments could also be applied to nanostructure devices such as nanostructure (e.g., nanosheet, nanowire, gate-all-around, or the like) field effect transistors (NSFETs). FIG. 28 is a cross-sectional view of NSFETs, in accordance with some other embodiments. FIG. 28 illustrates a similar cross-section as reference cross-section A-A illustrated in FIG. 1, except nanostructures/NSFETs are shown instead of fins/FinFETs. In this embodiment, the active fins 52 are replaced by nanostructures 152 formed by patterning a stack of alternating layers of channel layers and sacrificial layers. The nanostructures 152 are semiconductor strips formed over the substrate 50, and a dummy fin 62 is formed in an inactive region 50R between some of the nanostructures 152. The dummy fin 62 can be similar to any of the dummy fins described with respect to FIGS. 16, 25A, and 25B. In the illustrated embodiment, the inactive region 50R is part of the p-type region 50P, but the inactive region 50R could also be part of the n-type region 50N, or there could be inactive regions 50R in both the n-type region 50N and the p-type region 50P. Dummy gate stacks and source/drain regions are formed in a manner similar to the above-described embodiments. After the dummy gate stacks are removed, the sacrificial layers can be partially or fully removed in channel regions 68. The replacement gate structures are formed in a manner similar to the above-described embodiments, the replacement gate structures may partially or completely fill openings left by removing the sacrificial layers, and the replacement gate structures may partially or completely surround the dummy fin 62 and the channel layers in the channel regions 68 of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

Embodiments may achieve advantages. Forming the dummy fin 62 helps reduce pattern loading effects that may otherwise be caused by forming empty inactive regions 50R. For example, loading effects in subsequent CMP or etching process(es) may be reduced. Further, forming the dummy fin 62 to include a void 60 can help reduce the relative permittivity of the dummy fin 62 and decrease the total effective conductance of the dummy fin 62. As such, in addition to helping reduce pattern loading effects in subsequent processing, the dummy fin 62 also helps electrically isolate adjacent FinFETs from one another. Specifically, forming the void 60 can help decrease the effective capacitance between adjacent FinFETs by up to about 20%.

In an embodiment, a device includes: a first semiconductor fin extending from a substrate; a second semiconductor fin extending from the substrate; a dielectric fin disposed between the first semiconductor fin and the second semiconductor fin, the dielectric fin including a void; and an isolation region disposed between the dielectric fin and the substrate, the isolation region extending along sidewalls of the dielectric fin, sidewalls of the first semiconductor fin, and sidewalls of the second semiconductor fin. In some embodiments of the device, a top surface of the first semiconductor fin, a top surface of the second semiconductor fin, and a top surface of the dielectric fin are coplanar. In some embodiments, the device further includes: a gate structure extending along the top surface and the sidewalls of the dielectric fin, the top surface and the sidewalls of the first semiconductor fin, and the top surface and the sidewalls of the second semiconductor fin. In some embodiments of the device, the dielectric fin further includes a first dielectric layer surrounding the void, the first dielectric layer including a first dielectric material, the isolation region including a second dielectric material, the first dielectric material being different from the second dielectric material. In some embodiments of the device, the first dielectric material is silicon oxynitride, the second dielectric material is silicon oxide, and the void is filled with air or at a vacuum. In some embodiments of the device, the first dielectric material has a first relative permittivity, the second dielectric material has a second relative permittivity, and the void has a third relative permittivity, the third relative permittivity less than the second relative permittivity, the second relative permittivity less than the first relative permittivity. In some embodiments of the device, the dielectric fin further includes: a first dielectric layer over the substrate, the first dielectric layer surrounding a lower portion of the void, the first dielectric layer including a first dielectric material; a second dielectric layer over the first dielectric layer, the second dielectric layer surrounding a middle portion of the void, the second dielectric layer including a second dielectric material; and a third dielectric layer over the second dielectric layer, the third dielectric layer surrounding an upper portion of the void, the third dielectric layer including a third dielectric material, where the isolation region includes a fourth dielectric material, each of the first dielectric material, the second dielectric material, the third dielectric material, and the fourth dielectric material being different. In some embodiments of the device, the first dielectric material is silicon oxynitride, the second dielectric material is a high-k material, the third dielectric material is silicon oxynitride, the fourth dielectric material is silicon oxide, and the void is filled with air or at a vacuum. In some embodiments of the device, the first dielectric material has a first relative permittivity, the second dielectric material has a second relative permittivity, the third dielectric material has a third relative permittivity, the fourth dielectric material has a fourth relative permittivity, and the void has a fifth relative permittivity, the fifth relative permittivity less than the fourth relative permittivity, the fourth relative permittivity less than each of the first relative permittivity, the second relative permittivity, and the third relative permittivity.

In an embodiment, a device includes: a first semiconductor strip over a substrate, the first semiconductor strip including a first channel region; a second semiconductor strip over the substrate, the second semiconductor strip including a second channel region; a dielectric strip disposed between the first semiconductor strip and the second semiconductor strip, a width of the dielectric strip decreasing along a first direction extending away from the substrate, the dielectric strip including a void; and a gate structure extending along the first channel region, along the second channel region, and along a top surface and sidewalls of the dielectric strip. In some embodiments of the device, the first semiconductor strip is a first fin extending from the substrate and the second semiconductor strip is a second fin extending from the substrate. In some embodiments of the device, the first semiconductor strip is a first nanostructure over the substrate and the second semiconductor strip is a second nanostructure over the substrate. In some embodiments of the device, a width of the void decreases along the first direction. In some embodiments of the device, a width of the void is in a range of 1.5 nm to 2.5 nm. In some embodiments of the device, a height of the void is in a range of 48 nm to 60 nm.

In an embodiment, a method includes: forming a first semiconductor fin and a second semiconductor fin each extending in a first direction away from a substrate; forming an insulation material between the first semiconductor fin and the second semiconductor fin, the insulation material having a recess, a width of the recess decreasing along the first direction; depositing a first dielectric layer in the recess to form a void, the void including portions of the recess unfilled by the first dielectric layer; and recessing the insulation material to form a dielectric fin between the first semiconductor fin and the second semiconductor fin, the dielectric fin including the void and remaining portions of the first dielectric layer in the recess, the remaining portions of the first dielectric layer surrounding the void. In some embodiments of the method, the first dielectric layer is the only dielectric layer deposited in the recess. In some embodiments of the method, the void is continuously enclosed by the first dielectric layer. In some embodiments, the method further includes: depositing a second dielectric layer in the recess; and depositing a third dielectric layer on the second dielectric layer in the recess, where the first dielectric layer is deposited on the third dielectric layer. In some embodiments, recessing the insulation material includes: recessing the insulation material with a first etching process, the first etching process etching the insulation material at a faster rate than the first dielectric layer. In some embodiments of the method, the recess has a first width at a bottom of the recess and a second width at a top of the recess, the first width being from 0% to 30% greater than the second width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a first semiconductor fin and a second semiconductor fin each extending in a first direction away from a substrate;
forming an insulation material between the first semiconductor fin and the second semiconductor fin, the insulation material having a recess, a width of the recess decreasing along the first direction, the insulation material being formed of silicon oxide, an oxygen concentration of the silicon oxide increasing along the first direction;
depositing a first dielectric layer in the recess;
removing a portion of the first dielectric layer outside of the recess;
after removing the portion of the first dielectric layer outside of the recess, depositing a second dielectric layer on the first dielectric layer in the recess;
removing a portion of the second dielectric layer outside of the recess;
after removing the portion of the second dielectric layer outside of the recess, depositing a third dielectric layer on the second dielectric layer in the recess to form a void, the void comprising portions of the recess unfilled by the first dielectric layer, the second dielectric layer, and the third dielectric layer; and
recessing the insulation material to form a dielectric fin between the first semiconductor fin and the second semiconductor fin, the dielectric fin comprising the void and remaining portions of the first dielectric layer, the second dielectric layer, and the third dielectric layer in the recess, the remaining portions of the first dielectric layer, the second dielectric layer, and the third dielectric layer surrounding the void.

2. The method of claim 1, wherein recessing the insulation material comprises:
recessing the insulation material with a first etching process, the first etching process etching the insulation material at a faster rate than the third dielectric layer.

3. The method of claim 1, wherein the recess has a first width at a bottom of the recess and a second width at a top of the recess, the first width being from 0% to 30% greater than the second width.

4. The method of claim 1, wherein removing the portion of the first dielectric layer outside of the recess comprises etching the first dielectric layer, and removing the portion of the second dielectric layer outside of the recess comprises etching the second dielectric layer.

5. The method of claim 1, wherein the second dielectric layer has a greater relative permittivity than each of the first dielectric layer and the third dielectric layer.

6. A method comprising:
forming a first semiconductor fin and a second semiconductor fin each extending away from a substrate;
forming an insulation material between the first semiconductor fin and the second semiconductor fin, the insulation material having a recess between the first semiconductor fin and the second semiconductor fin;
forming a dielectric fin in the recess, the dielectric fin comprising a void, a relative permittivity of the void being less than a relative permittivity of the insulation material, wherein forming the dielectric fin comprises:
forming a first dielectric material in the recess;
recessing the first dielectric material;
after recessing the first dielectric material, forming a second dielectric material on the first dielectric material;
recessing the second dielectric material; and
after recessing the second dielectric material, forming a third dielectric material on the second dielectric material, wherein the first dielectric material, the second dielectric material, and the third dielectric material in combination surround the void; and
recessing the insulation material to form an isolation region, the isolation region extending along sidewalls of the dielectric fin, sidewalls of the first semiconductor fin, and sidewalls of the second semiconductor fin.

7. The method of claim 6, wherein a top surface of the first semiconductor fin, a top surface of the second semiconductor fin, and a top surface of the dielectric fin are coplanar.

8. The method of claim 6 further comprising:
forming a gate structure on the sidewalls of the dielectric fin, the sidewalls of the first semiconductor fin, and the sidewalls of the second semiconductor fin.

9. The method of claim 6, wherein the first semiconductor fin and the second semiconductor fin each extend in a first direction away from the substrate, and a width of the dielectric fin decreases along the first direction.

10. The method of claim 6, wherein a bottom surface of the second dielectric material forms a first acute angle with a plane parallel to a major surface of the substrate, and a top surface of the second dielectric material forms a second acute angle with the plane parallel to the major surface of the substrate.

11. The method of claim 6, wherein the second dielectric material has a greater relative permittivity than each of the first dielectric material and the third dielectric material.

12. The method of claim 6, wherein the first dielectric material and the third dielectric material are each silicon oxynitride with different oxygen and nitrogen compositions.

13. A method comprising:
forming a first semiconductor fin and a second semiconductor fin each extending away from a substrate;
forming an insulation material between the first semiconductor fin and the second semiconductor fin, the insulation material having a recess between the first semiconductor fin and the second semiconductor fin, wherein forming the insulation material comprises:
depositing amorphous silicon between the first semiconductor fin and the second semiconductor fin; and
oxidizing the amorphous silicon to form silicon oxide, an oxygen concentration of the silicon oxide increasing in a direction extending from a bottom of the silicon oxide to a top of the silicon oxide;
forming a dielectric fin in the recess, the dielectric fin comprising a void and a dielectric material, the void continuously enclosed by the dielectric material; and
recessing the insulation material to form isolation regions by selectively etching the insulation material at a faster rate than the dielectric material, wherein the dielectric fin, the first semiconductor fin, and the second semiconductor fin protrude above the isolation regions.

14. The method of claim 13, wherein forming the dielectric fin comprises:
  depositing the dielectric material in the recess; and
  planarizing the dielectric material and the insulation material until a top surface of the first semiconductor fin, a top surface of the second semiconductor fin, and a top surface of the dielectric fin are coplanar.

15. The method of claim 13, wherein the insulation material is silicon oxide, and the dielectric material is silicon oxynitride.

16. The method of claim 15, wherein etching the insulation material comprises etching the insulation material with dilute hydrofluoric acid.

17. The method of claim 13, wherein a relative permittivity of the void is less than a relative permittivity of the insulation material.

18. The method of claim 13, wherein a relative permittivity of the void is less than a relative permittivity of the dielectric material.

19. The method of claim 13, wherein a relative permittivity of the insulation material is less than a relative permittivity of the dielectric material.

20. The method of claim 13, wherein the amorphous silicon is deposited with chemical vapor deposition, and the amorphous silicon is oxidized with a directional oxidation process.

* * * * *